United States Patent
Lin et al.

(10) Patent No.: US 12,165,970 B2
(45) Date of Patent: Dec. 10, 2024

(54) SEMICONDUCTOR MEMORY STRUCTURE AND INTERCONNECT STRUCTURE OF SEMICONDUCTOR MEMORY STRUCTURE

(71) Applicant: TAIWAN SEMICONDUCTOR MANUFACTURING COMPANY LTD., Hsinchu (TW)

(72) Inventors: Meng-Han Lin, Hsinchu (TW); Sai-Hooi Yeong, Hsinchu County (TW); Chenchen Wang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/492,811

(22) Filed: Oct. 24, 2023

(65) Prior Publication Data
US 2024/0055349 A1    Feb. 15, 2024

Related U.S. Application Data

(62) Division of application No. 17/142,158, filed on Jan. 5, 2021, now Pat. No. 11,837,536.

(51) Int. Cl.
  *H01L 23/522* (2006.01)
  *H01L 23/528* (2006.01)
  *H10B 43/27* (2023.01)

(52) U.S. Cl.
  CPC ...... *H01L 23/5226* (2013.01); *H01L 23/5283* (2013.01); *H10B 43/27* (2023.02)

(58) Field of Classification Search
  CPC .. H01L 23/5226; H01L 23/5283; H10B 43/27
  USPC ......................................................... 257/324
  See application file for complete search history.

(56) References Cited

U.S. PATENT DOCUMENTS 9,520,199 B2 *  12/2016  Chang ................ G11C 16/0483

* cited by examiner

*Primary Examiner* — Tu-Tu V Ho
(74) *Attorney, Agent, or Firm* — WPAT LAW; Anthony King

(57) ABSTRACT

A semiconductor memory structure includes a first cell including a first source structure and a first drain structure, a second cell including a second source structure and a second drain structure, a first bit line, a first source line, a second bit line and a second source line. The first source line is coupled to the first source structure. The first bit line is coupled to the first drain structure. The second source line is coupled to the second source structure. The second bit line is coupled to the second drain structure. The first source line and the first bit line are in a first common layer. The second bit line and the second source line are in a second common layer. A distance between the first source line and the first bit line is similar to a distance between the second source line and the second bit line.

20 Claims, 23 Drawing Sheets

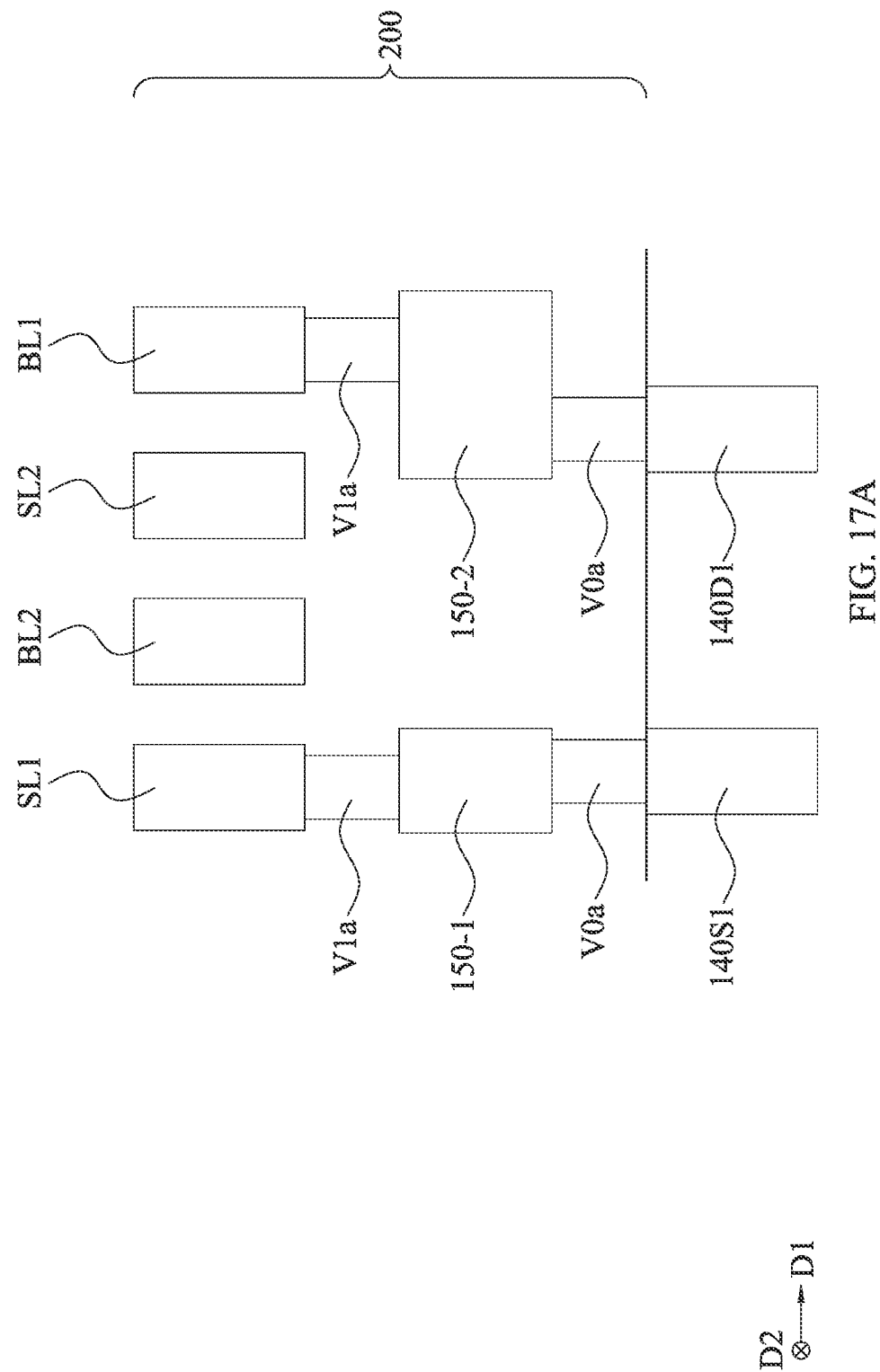

SEMICONDUCTOR MEMORY STRUCTURE AND INTERCONNECT STRUCTURE OF SEMICONDUCTOR MEMORY STRUCTURE

PRIORITY CLAIM AND CROSS-REFERENCE

This application is a divisional application of U.S. patent application Ser. No. 17/142,158, filed on Jan. 5, 2021, entitled of "SEMICONDUCTOR MEMORY STRUCTURE AND INTERCONNECT STRUCTURE OF SEMICONDUCTOR MEMORY STRUCTURE," which is incorporated herein by reference in its entirety.

BACKGROUND

Recently, great progress has been achieved in development of semiconductor memory devices. Due to continuously increasing requirements for memory devices with mass capacity, integration density of memory cells in a memory device keeps increasing. Scaling the memory cell size down and realizing high-density memory are eagerly needed for various applications such as internet of things (IoT) and mechanism learning. As shrinking critical dimensions of devices in integrated circuits approach the limits of common memory cell technologies, designers seek techniques for stacking multiple planes of memory cells to achieve greater storage capacity and lower per-bit costs. A three-dimensional (3D) memory array architecture has been realized by vertically stacking multiple cells on each cell region in a two-dimensional (2D) array matrix. There is a continuous demand for improved semiconductor memory structures for satisfying the above requirements.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 17A and 17B are exemplary cross-sectional views taken along line AI-AT and ling BI-BI' in FIG. 16 and schematically illustrate vertical layer arrangements of different portions of an interconnect structure of the semiconductor memory structure according to aspects of one or more embodiments of the present disclosure.

DETAILED DESCRIPTION

Figure 1:
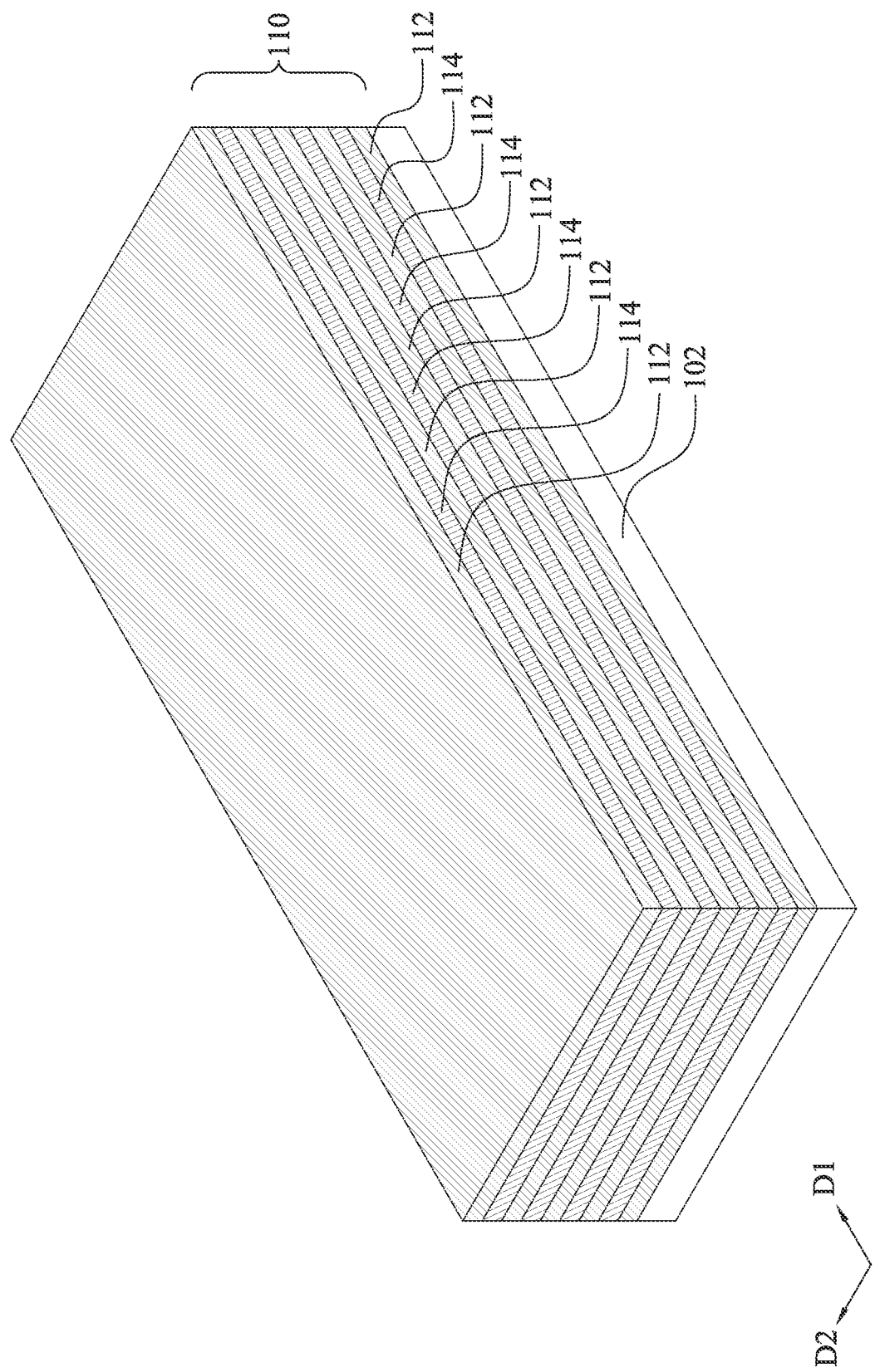
FIGS. 1, 2, 3, 4, 5, 6, 7, 8, 9 and 10A are perspective drawings illustrating various stages in a method for forming a semiconductor memory structure according to aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Many modern day electronic devices contain electronic memory configured to store data. Electronic memory may be volatile memory or non-volatile memory. Volatile memory stores data when it is powered, while non-volatile memory (NVM) is able to store data when power is removed. Unlike conventional NVM devices (e.g., flash, EEPROM, etc.), many promising candidates for next-generation NVM technology use memory cells that are located within a back-end-of-the-line (BEOL) of an integrated chip (e.g., located between metal interconnect layers overlying a semiconductor substrate). In some comparative approaches, the memory cells may have a memory array architecture realized in the BEOL interconnect structure. In some comparative approaches, the memory cells may have a memory array architecture connected by the BEOL interconnect structure.

For example, source lines (SLs) and bit lines (BLs) of the memory cells can be formed in the BEOL interconnect structure. In some embodiments, a BEOL interconnect structure can include a plurality of metal layers referred to, in ascending order, as the first metal layer M1, the second metal layer M2, and the nth metal layer Mn; and a plurality of connecting vias referred to as the zeroth via V0, the first via V1, and the (n−1)th via V(n−1), wherein n is a positive integer. The (n−1)th metal layer M(n−1) and the Nth metal layer Mn can be electrically connected by the (n−1)th via V(n−1). Further, the metal layer Mn and the connecting via V(n−1) can be formed in an inter-metal dielectric layer IMDn, which provides mechanical support and electrical isolation for the metal layer Mn and the connecting via V(n−1). In some embodiments, the source lines and the bit lines can be formed in a common metal layer, such as the first metal lines M1, which can be electrically connected to source structures and drain structures of the memory cells by the zeroth via V0. In such embodiments, it is found that a SL/BL routing pattern in a common metal layer may suffer from uneven line pitch issue, which results in an asymmetric SL/BL layout structure. Further, the uneven line pitch is not conducive to ease of manufacture, in that the SL/BL routing patterns may not be able to be manufactured given the processes and/or processing/lithography equipment used by an IC manufacturer, or the SL/BL routing patterns may be manufacturable but require too much time for mask creation. In addition, the asymmetric layout structure is not conducive to ease of design due to the uneven capacitance and non-uniform access time.

The present disclosure therefore provides a semiconductor memory structure and an interconnect structure of the semiconductor memory structure. In some embodiments, the semiconductor memory structure includes an even SL/BL line pitch and a symmetric layout structure. In some embodiments, by introducing an intervening conductive layer, the metal line routing can be arranged such that the line pitch can be made even. In some embodiments, by separating even metal lines from odd metal lines in different layers, the line pitch can be made even and increased. Accordingly, the uneven line pitch issue is mitigated and a symmetric interconnect layout structure can be obtained.

FIGS. 1, 2, 3, 4, 5, 6, 7, and 8A are perspective drawings illustrating various stages in a method for forming a semiconductor memory structure according to aspects of one or more embodiments of the present disclosure, and FIG. 8B is a cross-sectional view taken along line I-I' in FIG. 8A. Referring to FIG. 1, in some embodiments, a substrate 102 is received or provided. In some embodiments, the substrate 102 is a silicon substrate. Alternatively or additionally, the substrate 102 includes germanium, an alloy semiconductor (for example, SiGe), another suitable semiconductor material, or a combination thereof. Alternatively, the substrate 102 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some embodiments, the substrate 102 can include various devices, such as CMOS devices. For example, the substrate 102 can include CMOS devices under array (CuA), but the disclosure is not limited thereto.

As shown in FIG. 1, a stack 110 can be formed over the substrate 102. In some embodiments, the stack 110 includes a plurality of first layers 112 and a plurality of second layers 114. Further, the first layers 112 and the second layers 114 are alternately arranged. The number of the alternating layers included in the stack 110 can be as great as the number of layers needed for the semiconductor memory device. Further, in some embodiments, the topmost layer and the bottommost layer can both be the first layers 112, as shown in FIG. 1, but the disclosure is not limited thereto. Thicknesses of the first layers 112 and thicknesses of the second layers 114 can be similar or different, depending on different product requirements. In some embodiments, the first layers 112 include an insulating material while the second layers 114 include a conductive material. For example, in some embodiments, the first layers 112 include silicon oxide, and the second layers 114 include metals, but the disclosure is not limited thereto.

Figure 2:
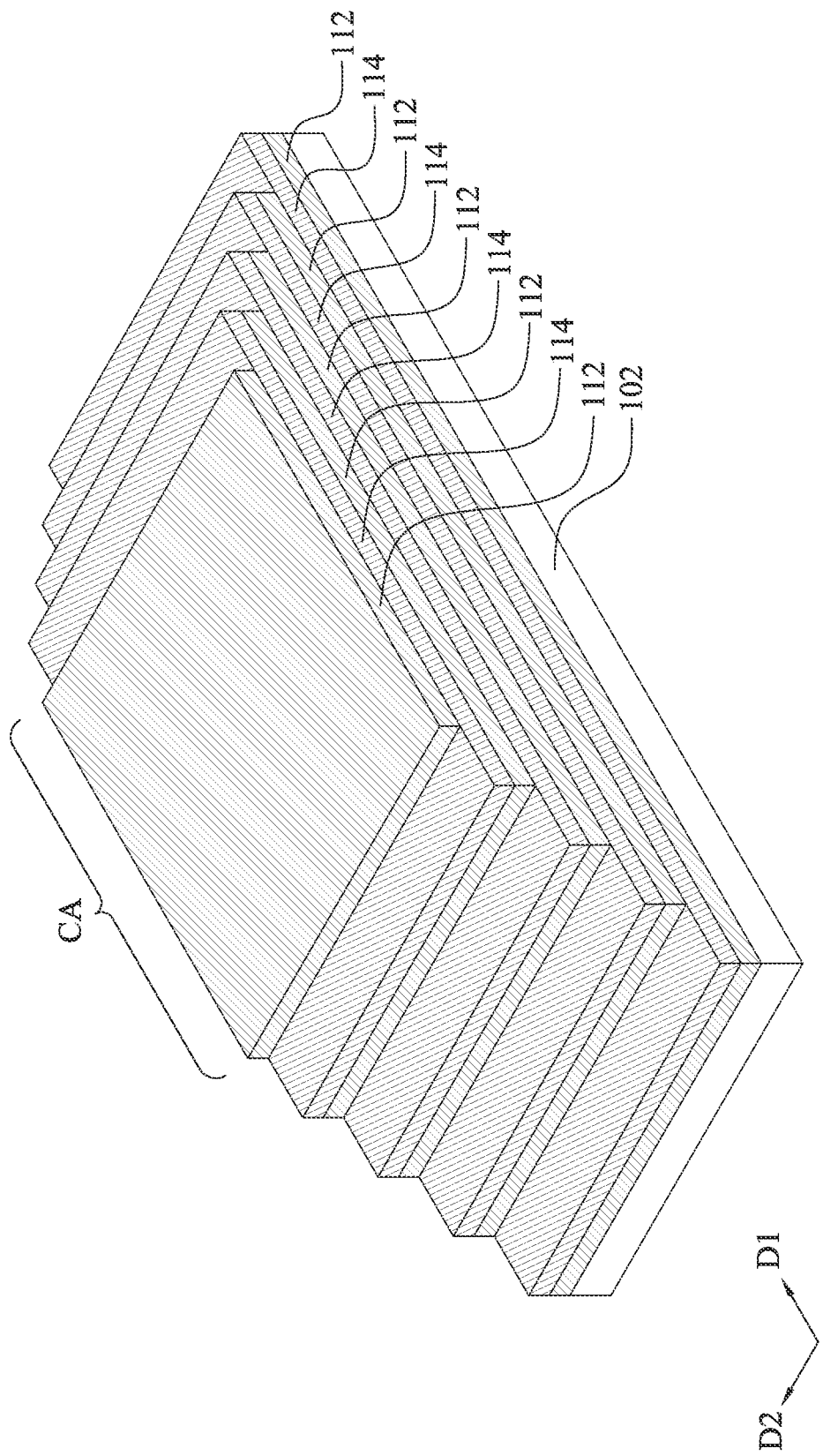

Referring to FIG. 2, portions of the first layers 112 and portions of the second layers 114 are removed, such that remaining first layers 112 and remaining second layers 114 form a staircase structure over the substrate 102. In some embodiments, portions of the second layers 114 are exposed, and areas of the exposed portions of the second layers 114 can be similar. In some embodiments, the remaining portion of the topmost first layer 112 can be used to define a location and a dimension of a cell array region CA, which is described below.

Figure 3:
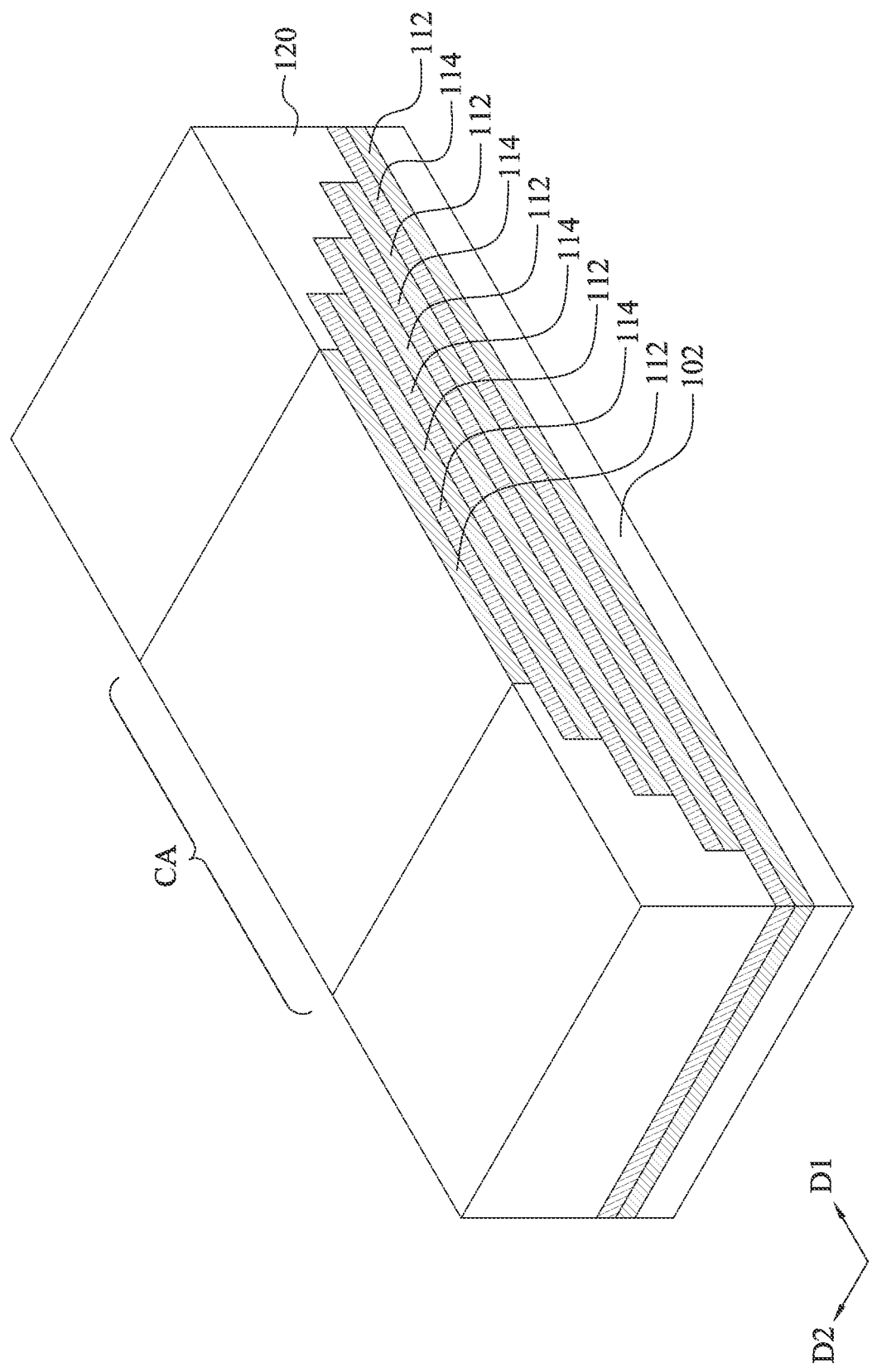

Referring to FIG. 3, in some embodiments, a dielectric structure 120 can be formed over the substrate 102. Further, a top surface of the dielectric structure 120 can be aligned with a top surface of the topmost first layer 112, as shown in FIG. 3. Consequently, an even and flush surface can be obtained.

Figure 4:
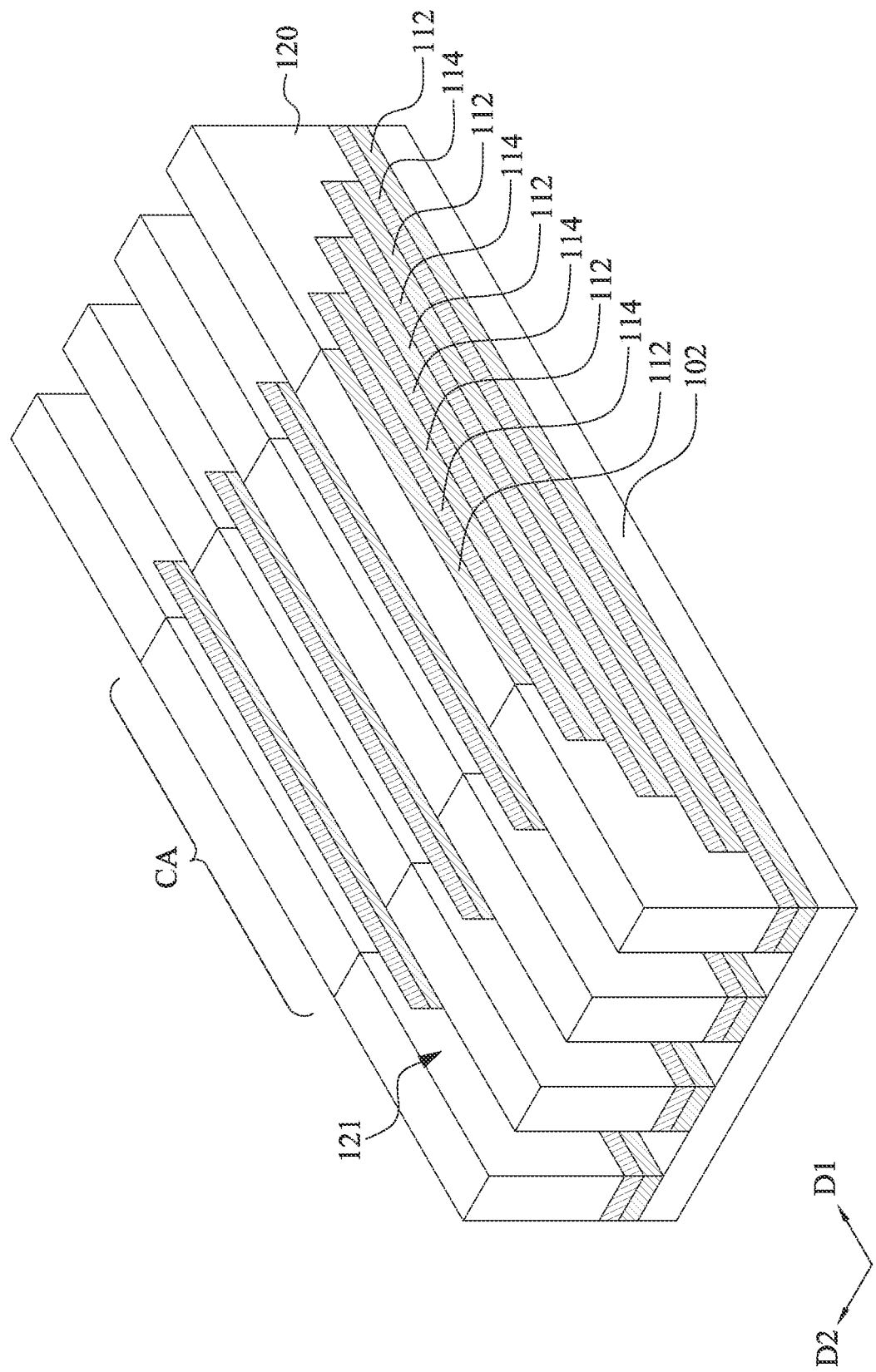

Referring to FIG. 4, in some embodiments, a plurality of trenches 121 are formed in the dielectric structure 120 and the stack 110. In some embodiments, each of the trenches 121 extends along a first direction D1 and the trenches 121 are arranged along a second direction D2, which is different from the first direction D1. In some embodiments, the first direction D1 and the second direction D2 are perpendicular to each other. Further, depths of the trenches 121 are similar to each other. In some embodiments, the substrate 102 can be exposed through a bottom of each trench 121, but the disclosure is not limited thereto. In some embodiments, the first layers 112 and the second layers 114 can be exposed through two opposite sidewalls of each trench 121.

Figure 5:
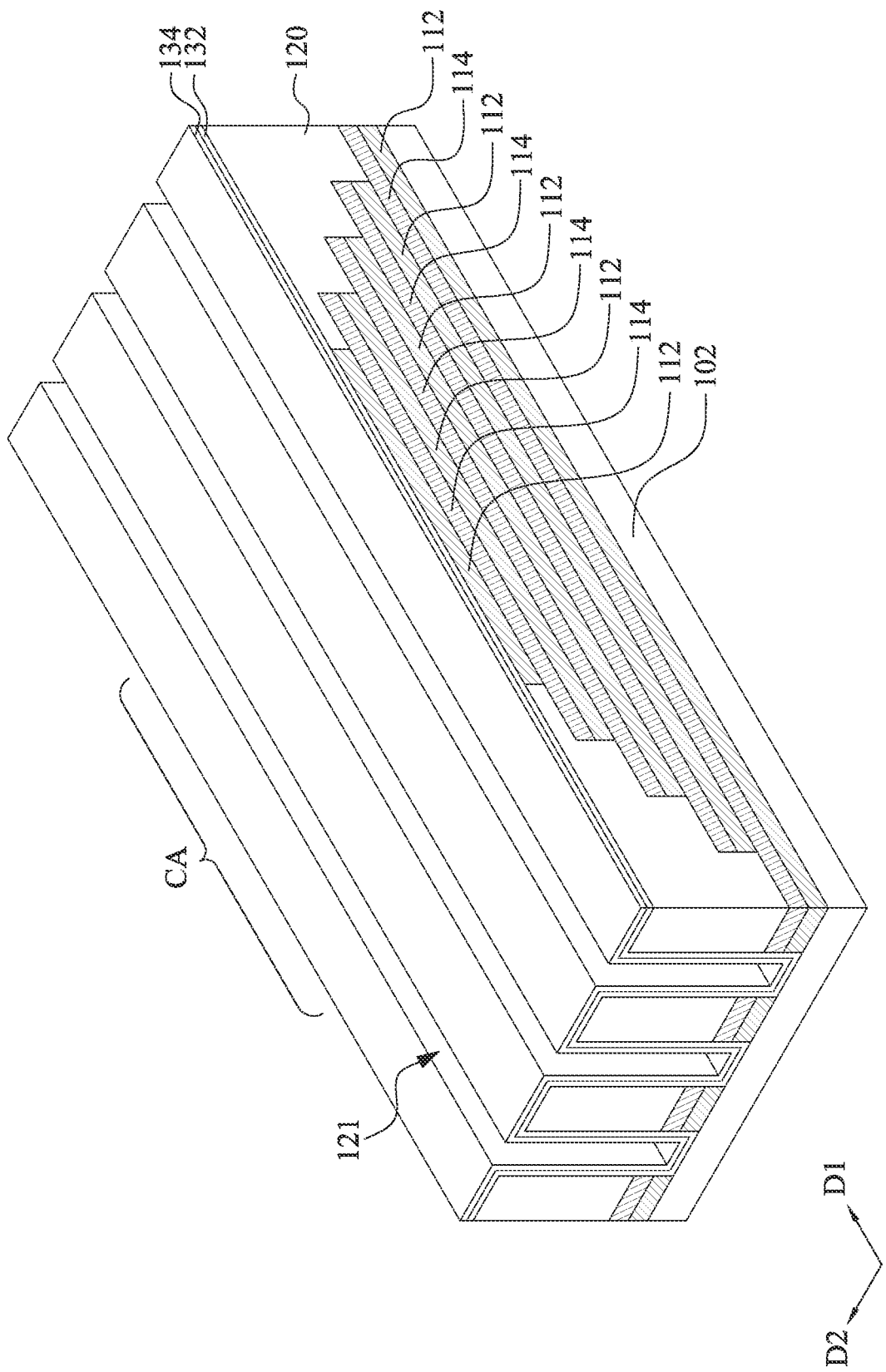

Referring to FIG. 5, in some embodiments, a charge-trapping layer 132 and a channel layer 134 are formed in each trench 121. In some embodiments, the charge-trapping layer 132 can be referred to as a memory layer. The charge-trapping layer 132 and the channel layer 134 can be conformally formed in each trench 121 by, for example but not limited thereto, a deposition. Therefore, the charge-trapping layer 132 and the channel layer 134 cover the sidewalls and the bottom of each trench 121. The charge-trapping layer 132 can include an insulating structure or a ferroelectric material. For example, in some embodiments, the charge-trapping layer 132 can include an insulating structure such as an oxide-nitride-oxide (ONO) structure, a nitride-oxide-nitride (NON) structure, a silicon oxynitride layer, or a silicon nitride layer. In some alternative embodiments, the charge-trapping layer 132 can include a ferroelectric material such as hafnium silicate (HfSiO), hafnium zirconium oxide (HfZrO, also referred to as HZO), or the like. The channel layer 134 can include semiconductor materials, oxide semiconductor or 2D materials. In some embodiments, the channel layer 134 can include oxide semiconductor materials such as indium gallium zinc oxide (IGZO), zinc oxide (ZnO), indium tungsten oxide (IWO), or the like.

Figure 6:
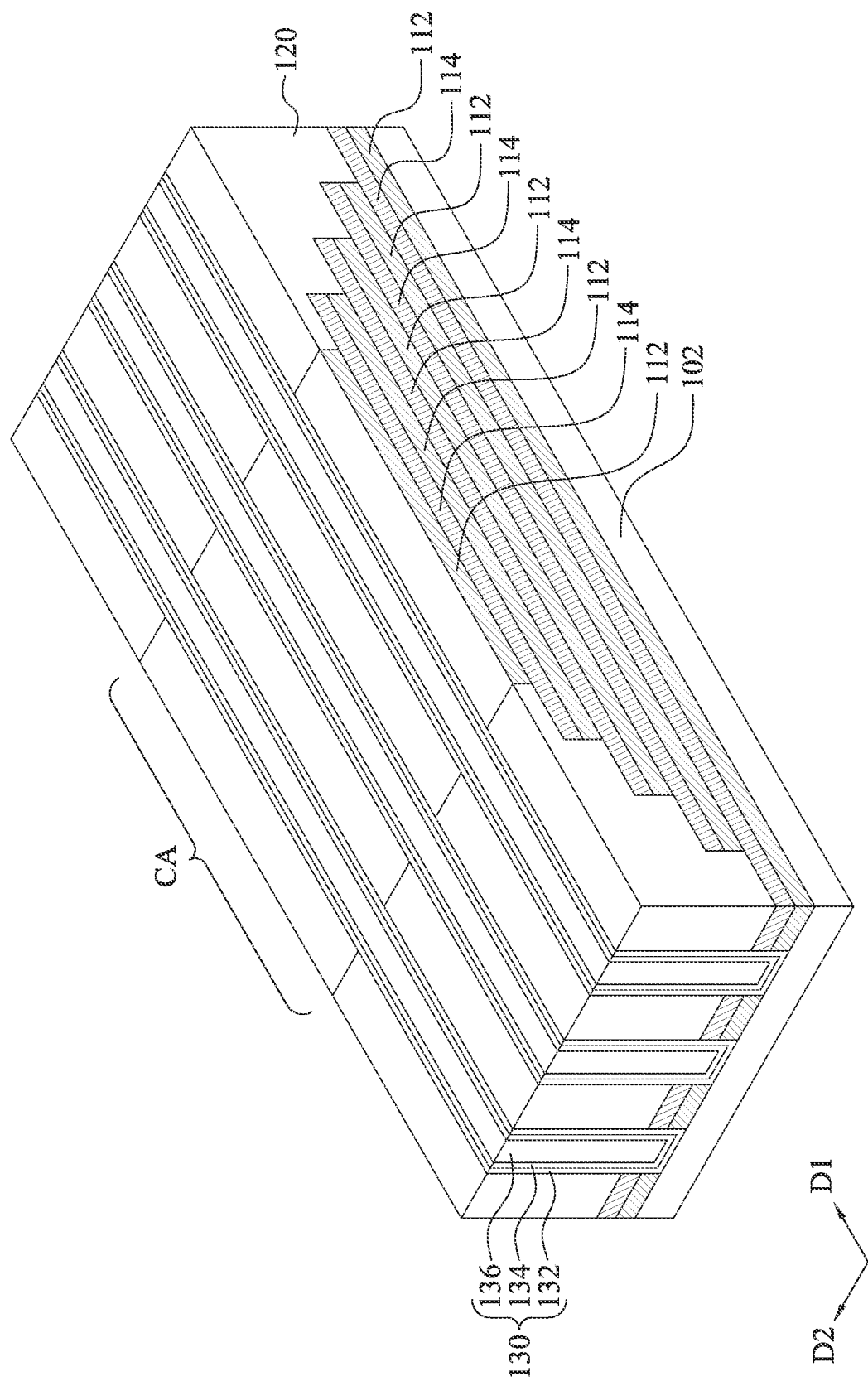

Still referring to FIG. 6, in some embodiments, an isolation 136 is formed in each trench 121 after the forming of the charge-trapping layer 132 and the channel layer 134. In some embodiments, the isolation 136 can be formed by filling each trench 121 with a dielectric material, such as silicon oxide, silicon oxycarbide, silicon oxynitride, silicon carbonitride, or the like. The dielectric material can be used to fill each trench 121 and covers a top surface of the stack 110 and the dielectric structure 120. A planarization operation such as a chemical mechanical polishing (CMP) operation can be performed to remove superfluous dielectric material to form the isolations 136. Accordingly, a top surface of the isolation 136, a top surface of the dielectric structure 120, the top surface of the topmost first layer 112, a topmost surface of the charge-trapping layer 132, and a topmost surface of the channel layer 134 can be aligned with each other. In some embodiments, the charge-trapping layer 132, the channel layer 134 and the isolation 136 can be referred to as a hybrid structure 130 that extends along the first direction D1. Further, the hybrid structure 130 passes through the cell array region CA, as shown in FIG. 6.

Figure 7:
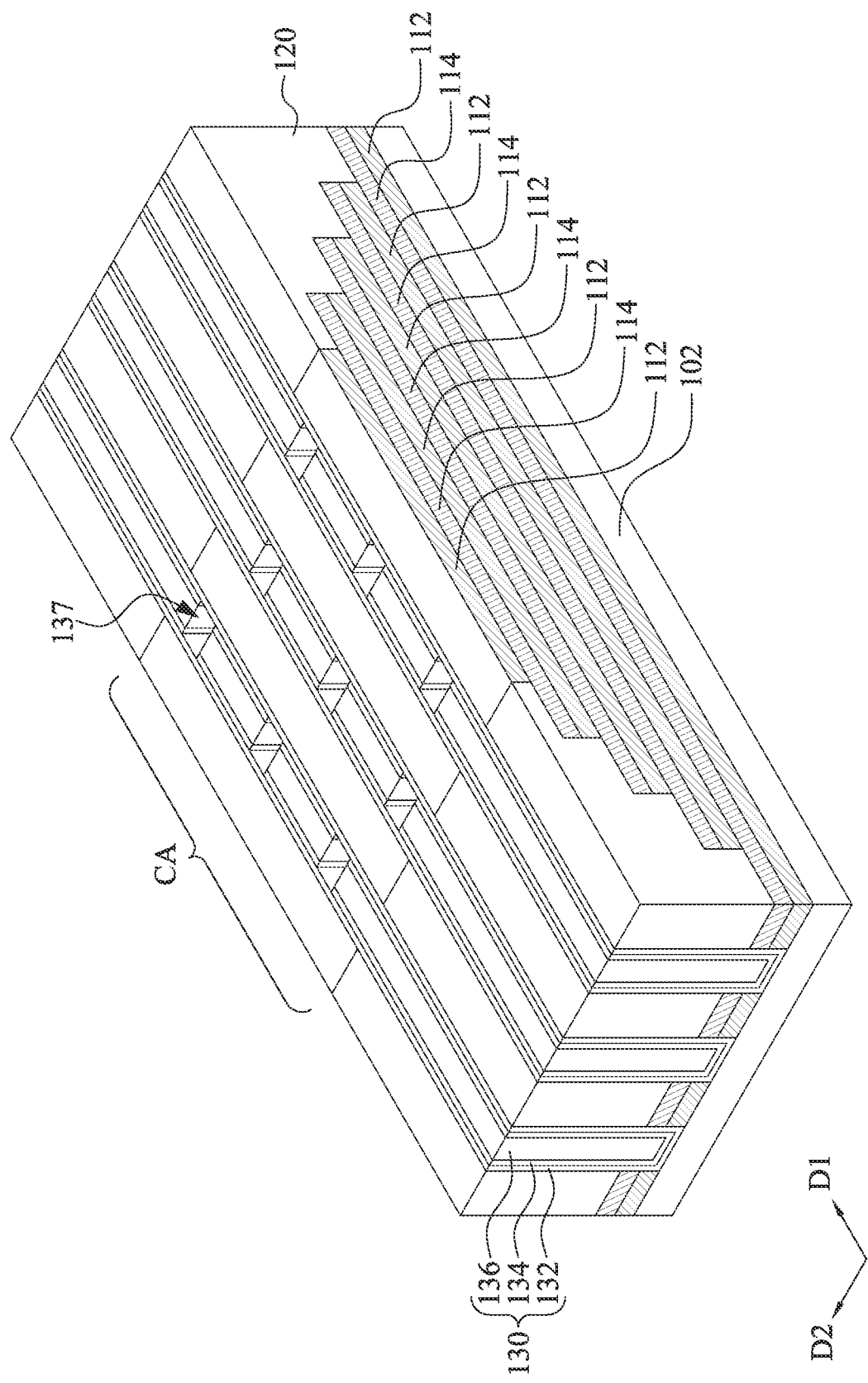

Referring to FIG. 7, in some embodiments, portions of the isolation 136 and portions of the channel layer 134 are removed. Accordingly, a plurality of first recesses 137 are formed in the cell array region CA. In some embodiments, dimensions of the first recesses 137 are the same. The first recesses 137 may be arranged in the hybrid structure 130 along the first direction D1. Further, distances between adjacent first recesses 137 in each hybrid structure 130 are the same. Additionally, the channel layer 134 in each hybrid structure 130 may be interrupted by the first recesses 137, as shown in FIG. 7. In the cell array region CA, the first recesses 137 are arranged to form a staggered pattern, but the disclosure is not limited thereto.

Figure 8:
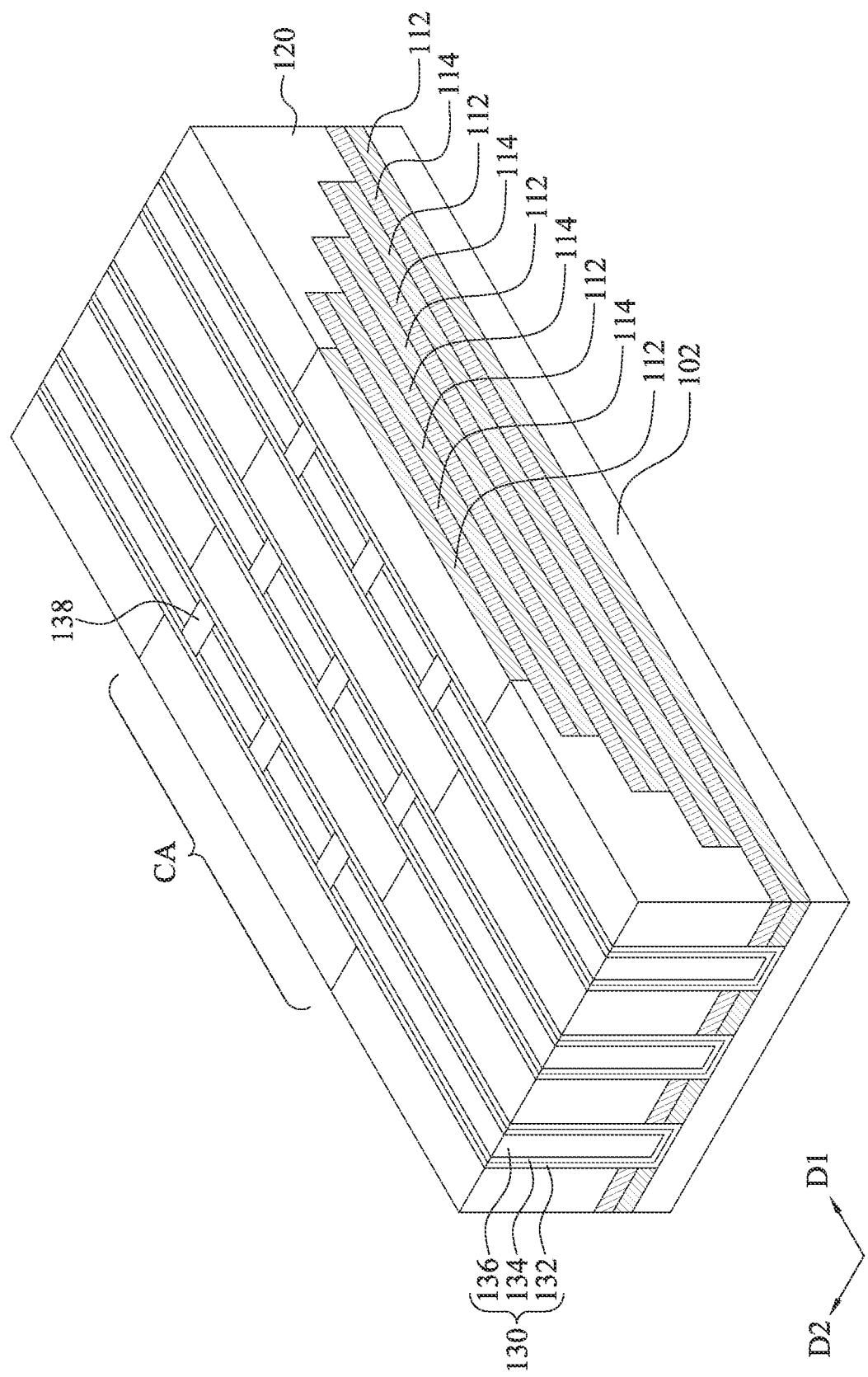

Referring to FIG. 8, an isolation 138 is formed in each first recess 137. In some embodiments, the first recesses 137 are filled with a dielectric material, and a planarization operation such as a CMP operation is performed to remove superfluous dielectric material and form the isolation 138. In some embodiments, materials for forming the isolation 138 can be similar to those mentioned above; therefore, repeated descriptions of such details are omitted for brevity. Accordingly, a top surface of the isolation 138, the top surface of the isolation 136, the top surface of the hybrid structure 130, and the top surface of the stack 110 (i.e., the top surface of the topmost first layer 112) can be aligned with each other.

Figure 9:
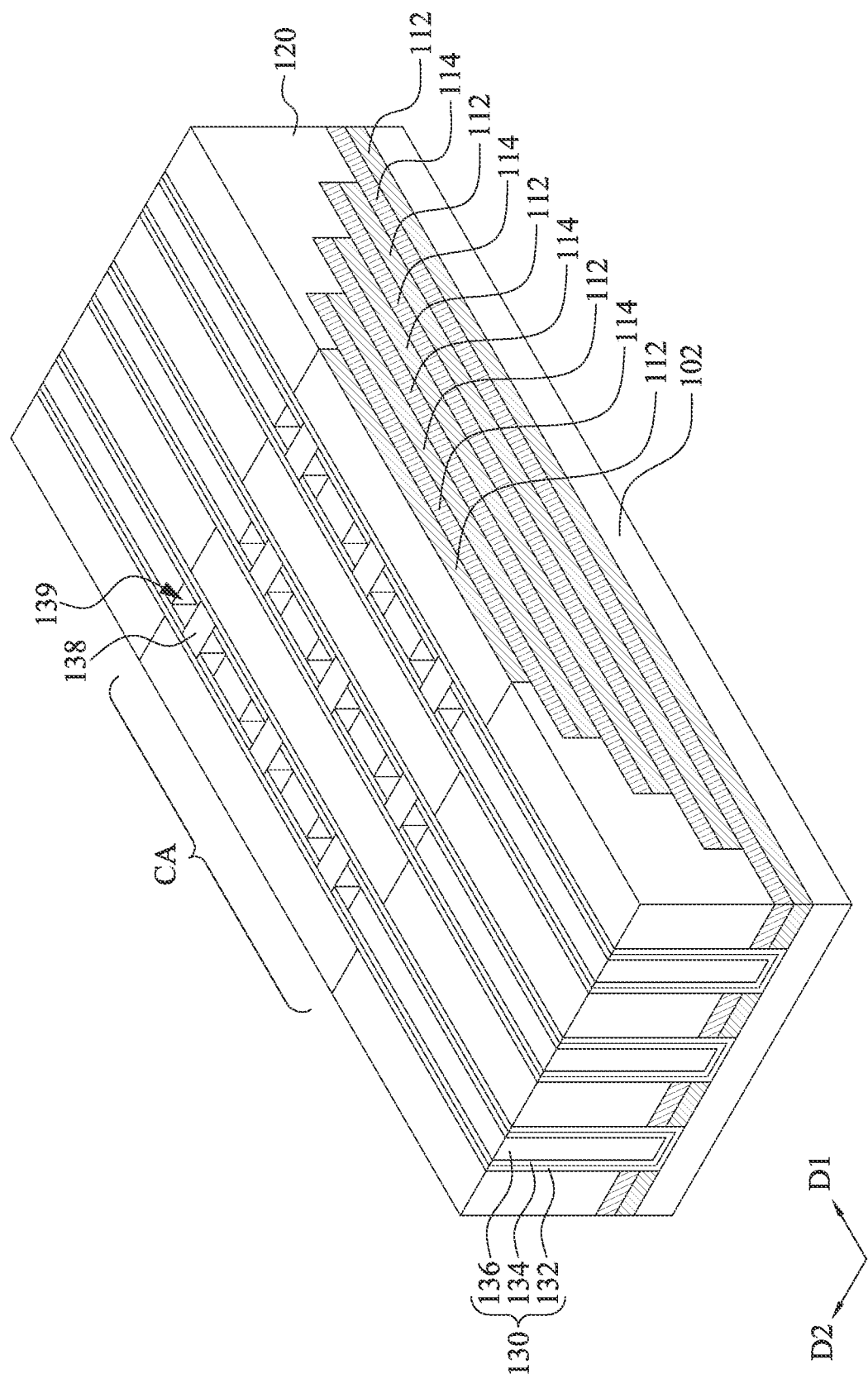

Referring to FIG. 9, in some embodiments, a plurality of second recesses 139 are formed at two sides of each isolation 138. In such embodiments, portions of the isolations 136 at the two sides of each isolation 138 are removed, thus forming the second recesses 139 at the two sides of the isolation 138. In some embodiments, the second recesses 139 have similar dimensions and similar depths. Further, the channel layer 134 can be exposed through two opposite sidewalls of each second recess 139.

Figure 10A:
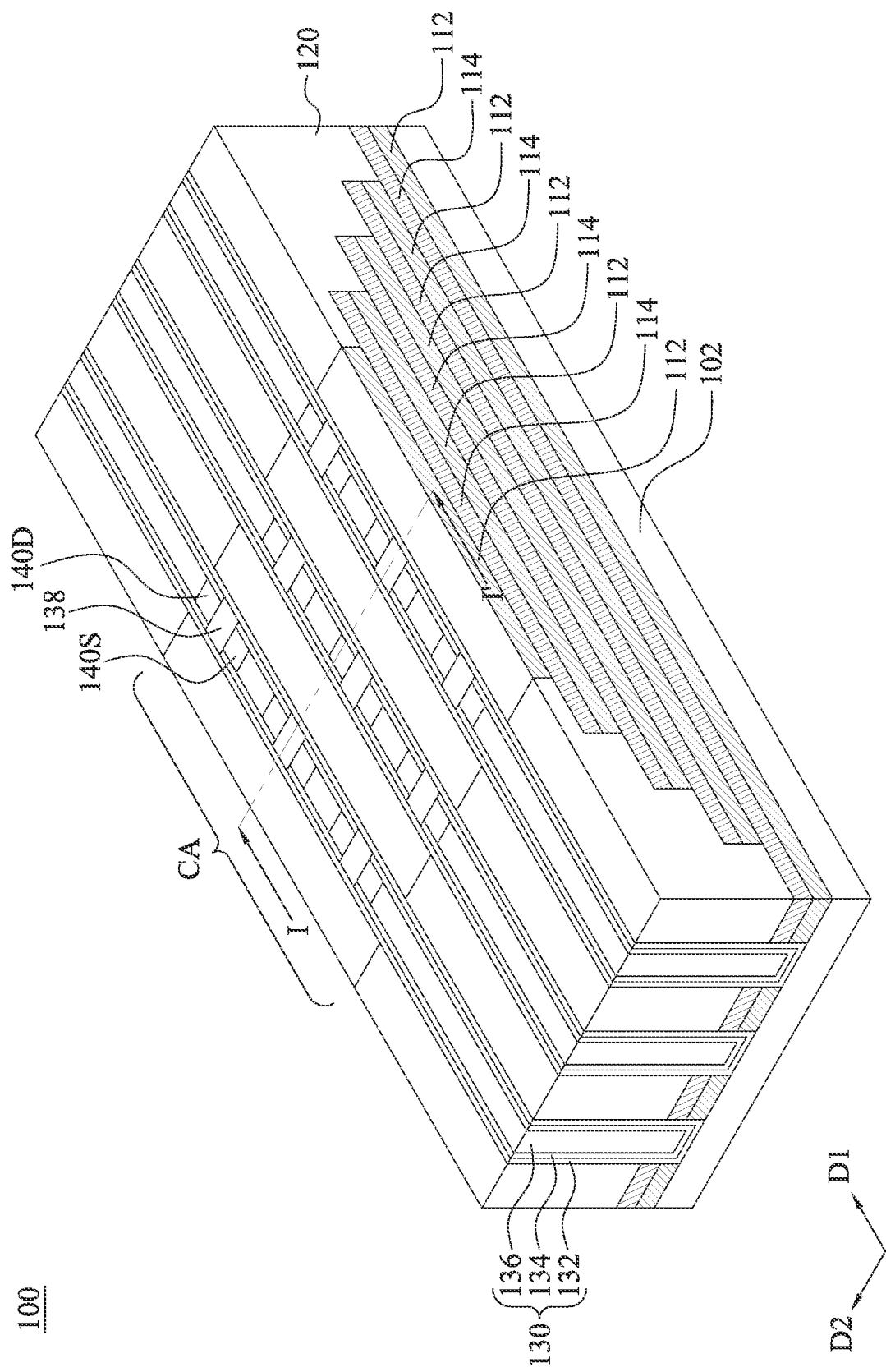
Figure 10B:
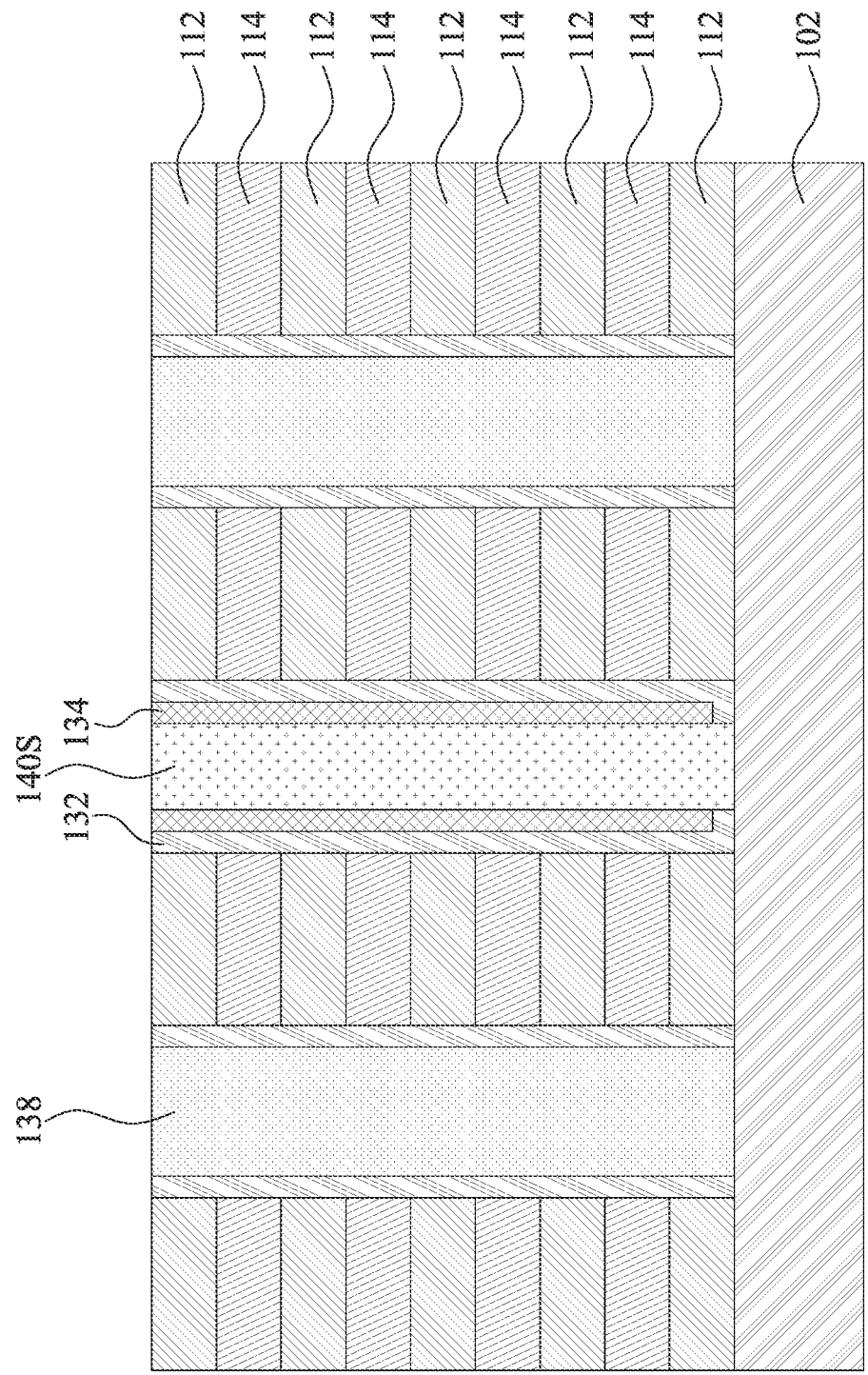
FIG. 10B is a cross-sectional view taken along line I-I' in FIG. 10A.

Referring to FIGS. 10A and 10B, a source structure 140S and a drain structure 140D are respectively formed in the second recesses 139. In some embodiments, a barrier layer (not shown) can be formed to cover sidewalls and a bottom of each second recess 139, and then the second recesses 139 are filled with a conductive material. A planarization operation such as a CMP operation is performed to remove superfluous portions of the barrier layer and the conductive material. Consequently, the source structure 140S and the drain structure 140D are formed at the two sides of the isolation 138. In some embodiments, the conductive material can include doped polysilicon, doped amorphous silicon, tungsten, copper, or the like. In some embodiments, a plurality of stacked memory cells can be formed in the cell array region CA after the forming of the source structure 140S and the drain structure 140D.

Figure 11:
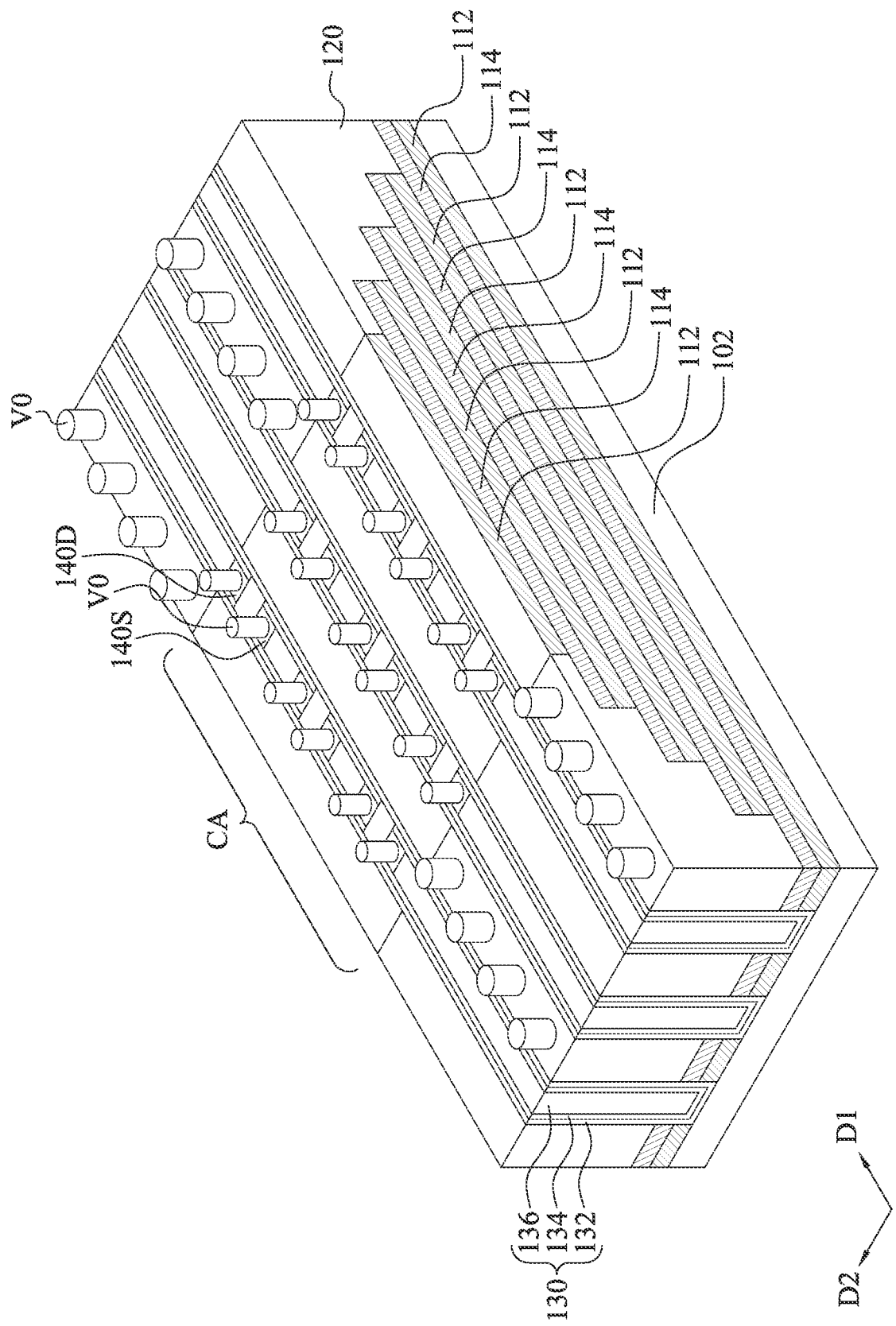
FIGS. 11, 12, 13, 14 and 15 are perspective drawings of a portion of a semiconductor memory structure in various stages subsequent to FIGS. 10A and 10B in the method for forming a semiconductor memory structure according to aspects of one or more embodiments of the present disclosure.
Figure 12:
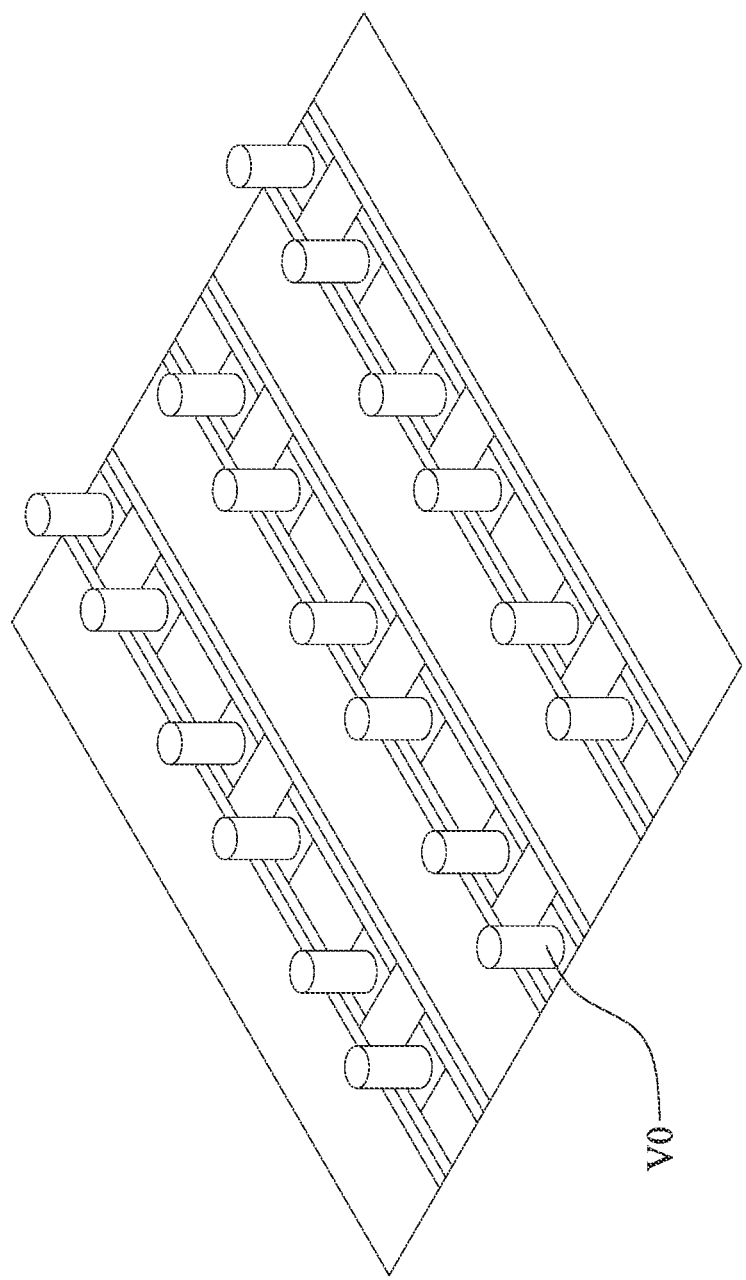
Figure 13:
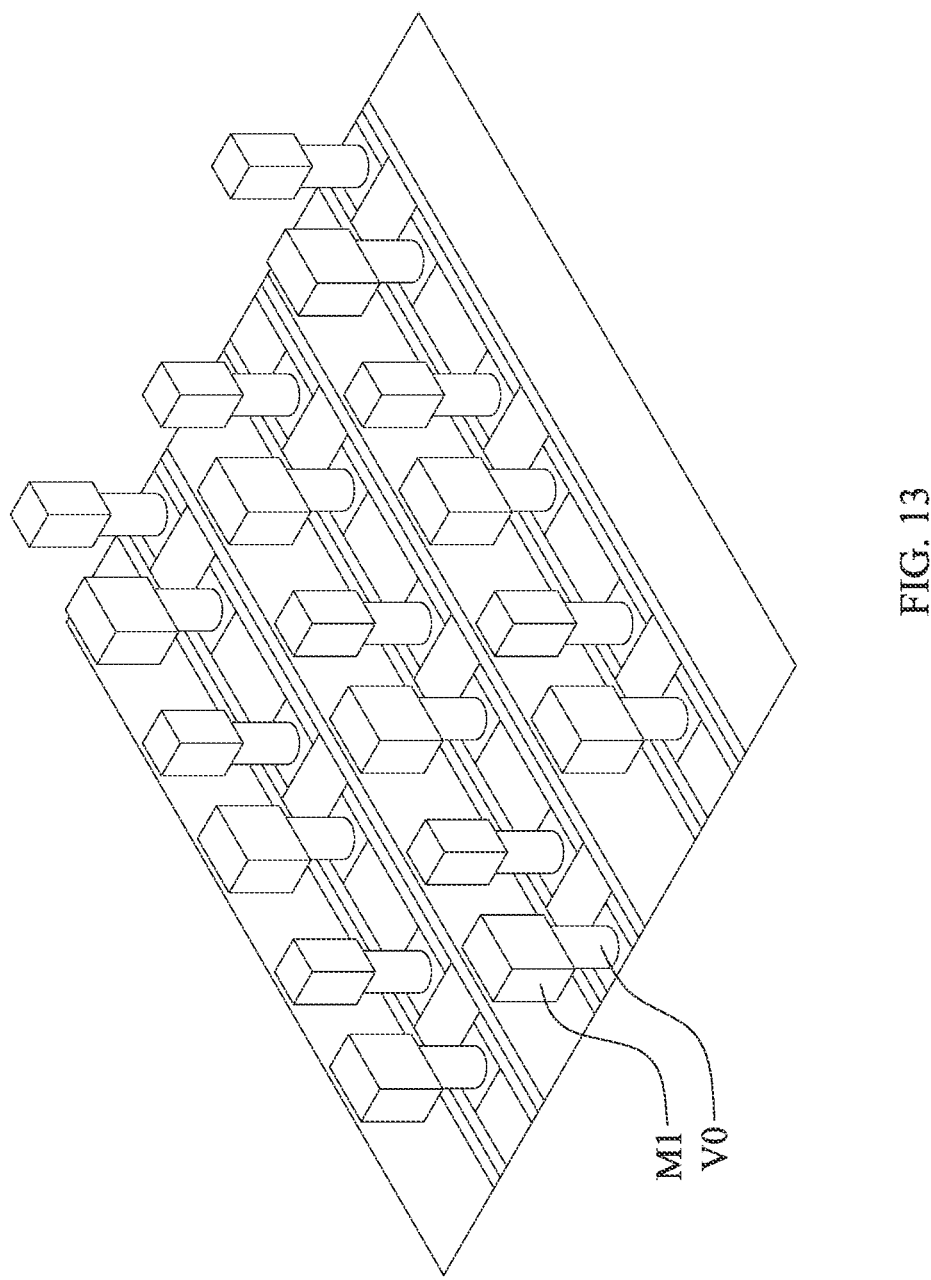

Please refer to FIGS. 11, 12, 13, 14 and 15, which are perspective drawings of a portion of a semiconductor memory structure in various stages subsequent to FIGS. 10A and 10B. In some embodiments, FIGS. 12 to 15 are perspective drawings of the cell array region CA of the semiconductor memory structure 100. In some embodiments, MEOL and/or BEOL manufacturing operations can be performed to form an interconnect structure 200 or 300 over the memory cells. Referring to FIG. 12, in some embodiments, a plurality of vias such as the zeroth vias V0 can be formed on and coupled to each source structure 140S and each drain structure 140D. Referring to FIG. 13, in some embodiments, a plurality of conductive lines such as the first metal layers M1 can be formed on and coupled to the zeroth vias V0. It should be noted that the zeroth vias V0 and the first metal layers M1 can be formed by dual damascene operations. Therefore, the operation shown in FIGS. 11 and 12 can be omitted and, by using the dual damascene operations, the zeroth vias V0 and the first metal layers M1 can be directly formed as shown in FIG. 13.

In addition, the zeroth vias V0 can also be formed to couple to the second layers 114 in the stack 110, as shown in FIG. 11. In such embodiments, the zeroth vias V0 in the same column along the first direction D1 may have different depths, while the zeroth vias V0 in the same row along the second direction may have same depths. In some embodiments, the zeroth vias V0 coupled to the second layers 114 help to electrically connect the second layers 114 to overlying metal layer, though not shown.

Figure 14:
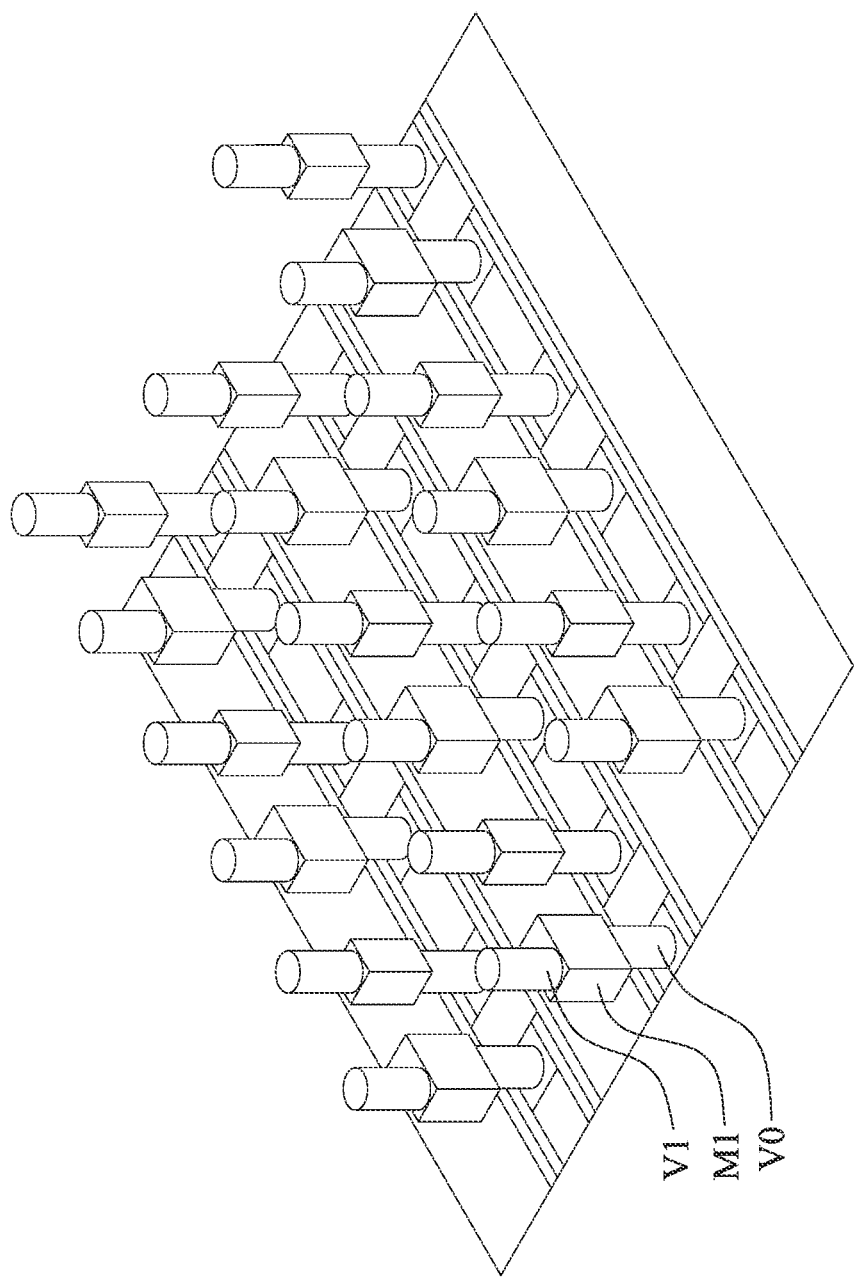
Figure 15:
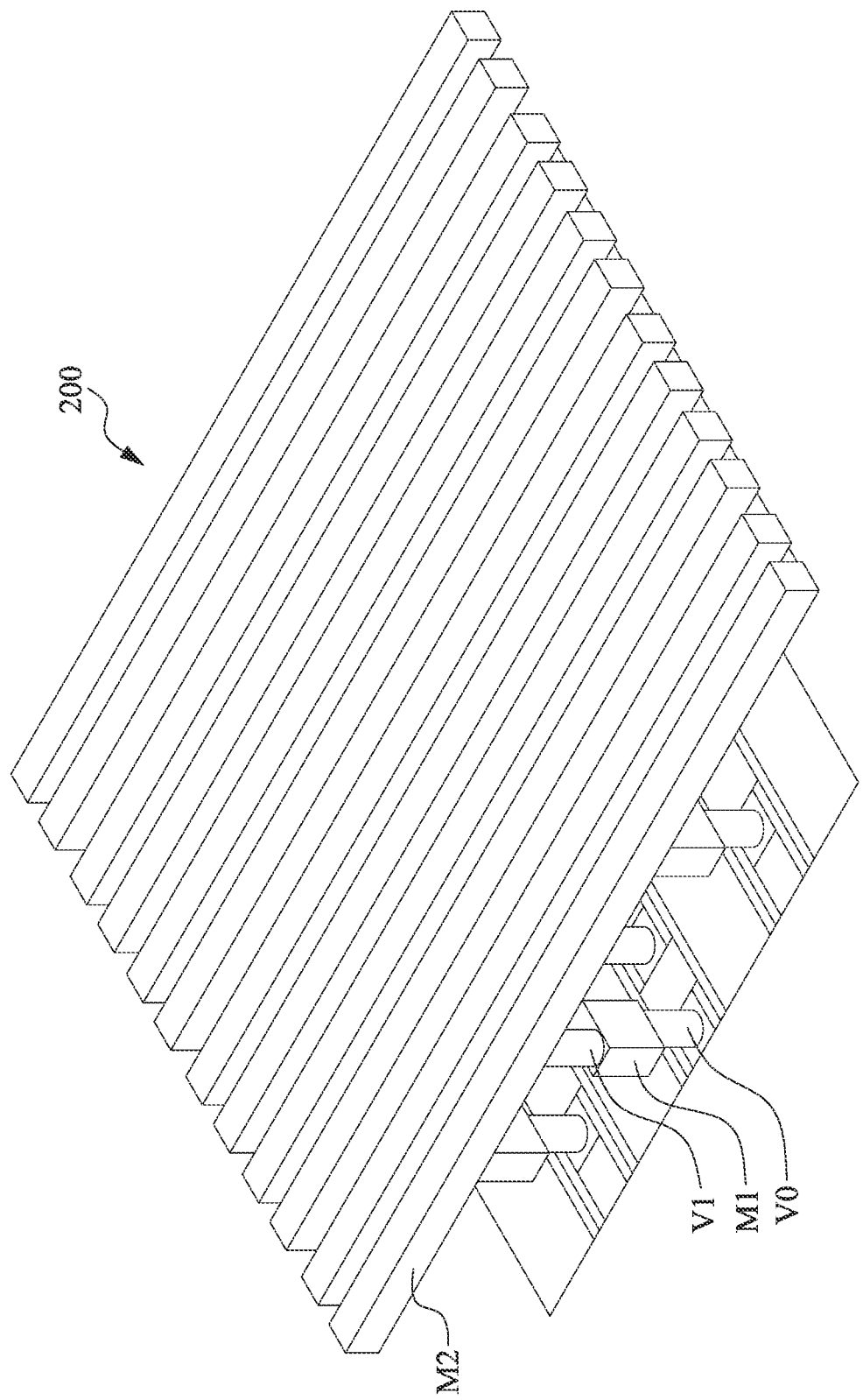

Referring to FIG. 14, in some embodiments, a plurality of vias such as the first vias V1 can be formed on and coupled to the first metal layers M1. Referring to FIG. 15, in some embodiments, a plurality of conductive lines such as the second metal layers M2 can be formed on and coupled to the first vias V1. It should be noted that the first vias V1 and the second metal layers M2 can be formed by dual damascene operations. Therefore, the operation shown in FIG. 14 can be omitted and, by using the dual damascene operations, the first vias V1 and the second metal lines M2 can be directly formed as shown in FIG. 15. In some embodiments, more vias such as second vias V2, third vias V3, and (n−1)th vias V(n−1), and metal layers such as third metal layers M3, fourth metal layers M4 and nth metal layers Mn can be formed over the substrate 102. Consequently, a semiconductor memory structure 100 including an interconnect structure 200 or 300 can be obtained.

Figure 16:
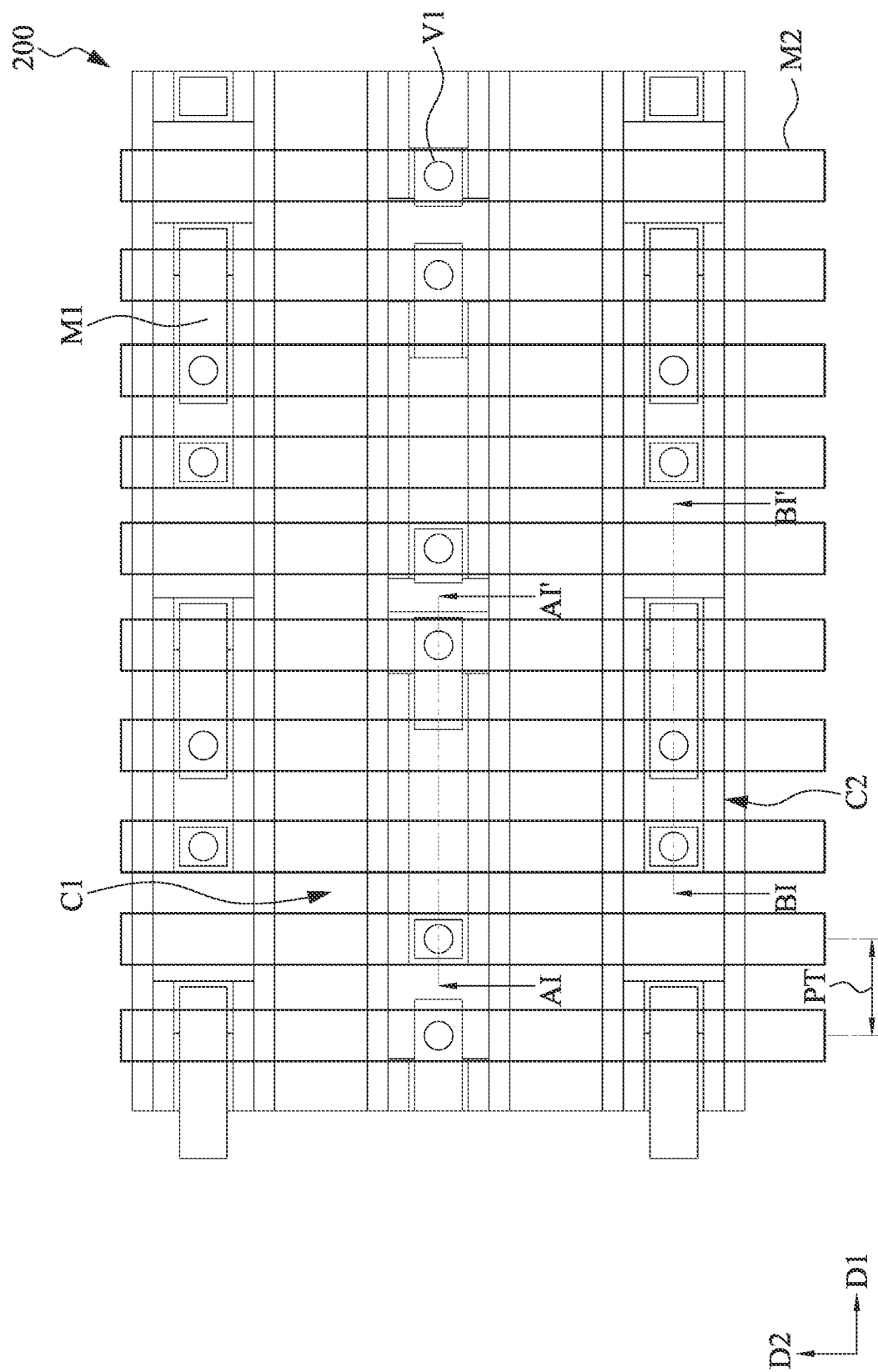
FIG. 16 is a schematic drawing illustrating a layout structure of a portion of a semiconductor memory structure according to aspects of one or more embodiments of the present disclosure.
Figure 17B:
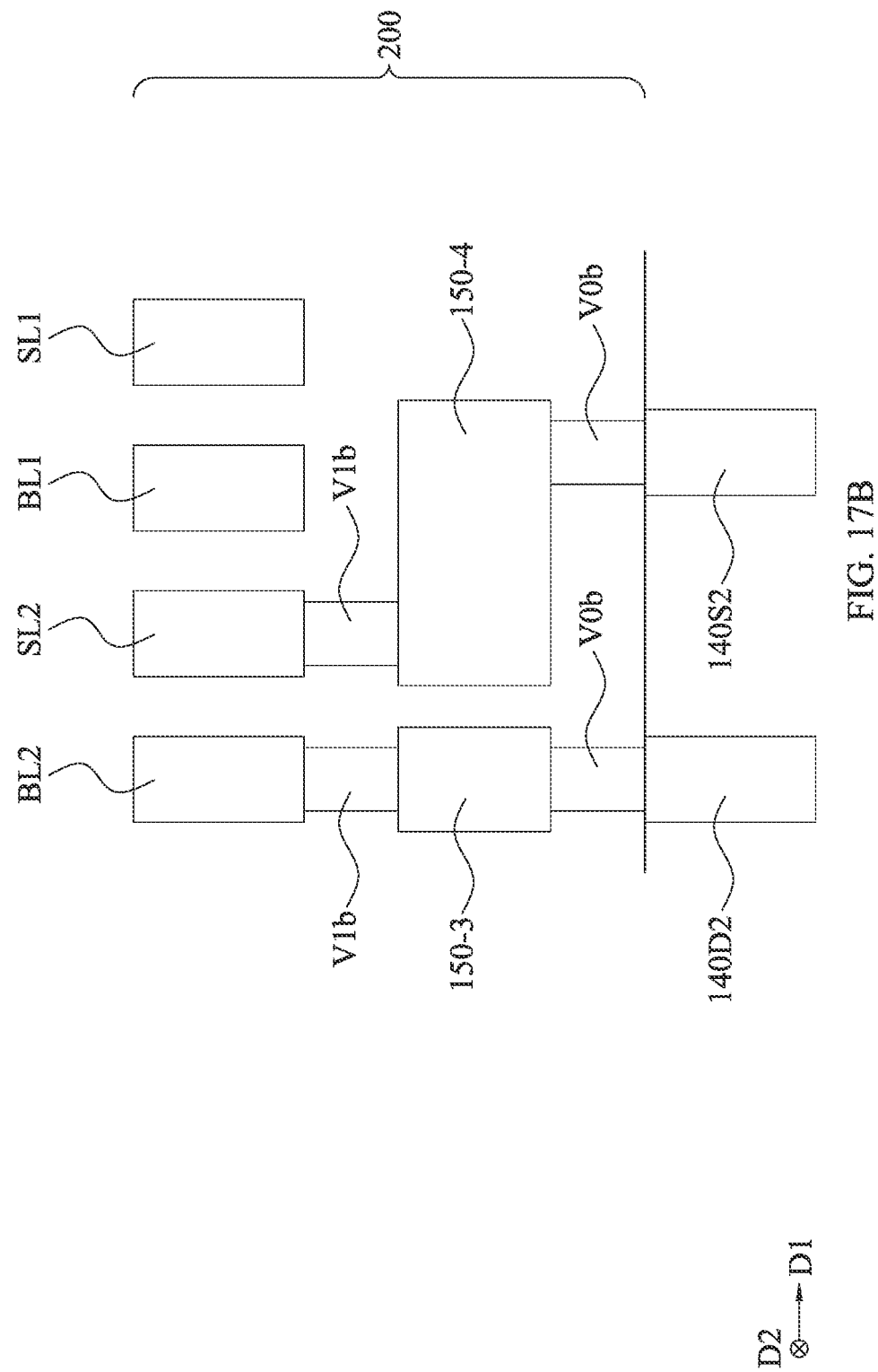

Please refer to FIGS. 16, 17A, and 17B, wherein FIG. 16 is a schematic drawing illustrating a layout structure of a portion of a semiconductor memory structure according to aspects of one or more embodiments of the present disclosure, and FIGS. 17A and 17B are exemplary cross-sectional views schematically illustrating vertical layer arrangements of different portions of an interconnect structure 200 of a semiconductor memory structure 100 according to aspects of one or more embodiments of the present disclosure. In some embodiments, the interconnect structure 200 can be disposed over memory cells as mentioned above, but the disclosure is not limited thereto.

In some embodiments, semiconductor memory structure 100 includes a first cell C1 and a second cell C2. In some embodiments, the first cell C1 and the second cell C2 can be disposed in the cell array region CA. The first cell C1 and the second cell C2 both extend along the first direction D1. Further, the first cell C1 and the second cell C2 are separated from each other along the second direction D2. In some embodiments, the first cell C1 and the second cell C2 are offset from each other along the first direction D1. In such embodiments, the first cell C1 and the second cell C2 can be arranged in a repeating manner in the cell array region CA to form a staggered pattern as shown in FIG. 16. The first cell C1 includes a first source structure 140S1 and a first drain structure 140D1. The first source structure 140S1 is separated from the first drain structure 140D1 by the isolation 138. The second cell C2 includes a second source structure 140S2 and a second drain structure 140D2. The second source structure 140S2 is separated from the second drain structure 140D2 by the isolation 138. It should be noted that the second layers 114 in the stack 110 serve as the gate layers (also referred to as the word lines) in the cell array region CA; therefore, the locations of the gate layers of each memory cell should be easily understood, although they are not shown in FIGS. 16, 17A and 17B.

In some embodiments, the semiconductor memory structure 100 includes a first source line SL1 coupled to the first source structure 140S1 and a first bit line BL1 coupled to the first drain structure 140D1. The semiconductor memory structure 100 includes a second bit line BL2 coupled to the second drain structure 140D2 and a second source line SL2 coupled to the second source structure 140S2. It should be noted that the first source line SL1, the first bit line BL1, the second source line SL2 and the second bit line BL2 extend along the second direction D2. Further, the first source line SL1, the first bit line BL1, the second source line SL2 and the second bit line BL2 are arranged in an order of SL1, BL2, SL2 and BL1. In some embodiments, the second bit line BL2 and the second source line SL2 are between the first source line SL1 and the first bit line BL1, and the second bit line BL2 is between the first source line SL1 and the second source line SL2, as shown in FIG. 15. In some embodiments, a width of a feature can be defined as a distance between two opposite sides measured along the first direction D1. In such embodiments, a width of the first source line SL1, a width of the first bit line BL1, a width of the second source line SL2, and a width of the second bit line BL2 are similar. It should be noted that, a distance between the first source line SL1 and the second bit line BL2, a distance between the second bit line BL2 and the second source line SL2, and a distance between the second source line SL2 and the first bit line BL1 are similar. In some embodiments, pitches PT, which are defined as the center-to-center or edge-to-edge distance between features, between adjacent source and bit lines are substantially the same.

In some embodiments, the first source line SL1, the first bit line BL1, the second source line SL2, and the second bit line BL2 are in a common layer of the interconnect structure 200. For example, the first source line SL1, the first bit line BL1, the second source line SL2, and the second bit line BL2 can all be referred to as the second metal layers M2 of the interconnect structure 200 of the semiconductor memory structure 100, but the disclosure is not limited thereto.

The semiconductor memory structure 100 includes a first conductive line 150-1 between the first source structure 140S1 and the first source line SL1, a second conductive line 150-2 between the first drain structure 140D1 and the first bit line BL1, a third conductive line 150-3 between the second drain structure 140D2 and the second bit line BL2, and a fourth conductive line 150-4 between the second source structure 140S2 and the second source line SL2. In some embodiments, the first conductive line 150-1 is disposed over the first source structure 140S1. The second conductive line 150-2 is disposed over the first drain structure 140D1 and extends to cover a portion of the isolation 136. The third conductive line 150-3 is disposed over the second drain structure 140D2. The fourth conductive line 150-4 is disposed over the second source structure 140S2 and extends to cover a portion of the isolation 138. In some embodiments, the first conductive line 150-1, the second conductive line 150-2, the third conductive line 150-3, and the fourth conductive line 150-4 are in a common layer of the interconnect structure 200. For example, the first conductive line 150-1, the second conductive line 150-2, the third conductive line 150-3, and the fourth conductive line 150-4 can all be referred to as the first metal layers M1 of the interconnect structure 200 of the semiconductor memory structure 100, but the disclosure is not limited thereto.

As mentioned above, a width of a feature can be defined as a distance between two opposite sides measured along the first direction D1. Therefore, a width of the first conductive line 150-1 and a width of the second conductive line 150-2 are different from each other, as shown in FIG. 17A. In some embodiments, the width of the second conductive line 150-2 is greater than the width of the first conductive line 150-1. A width of the third conductive line 150-3 and a width of the fourth conductive line 150-4 are also different from each other, as shown in FIG. 17B. In some embodiments, the width of the fourth conductive line 150-4 is greater than the width of the third conductive line 150-3. In some embodiments, the first conductive line 150-1 and the second conductive line 150-2 are separated from each other by a first distance while the third conductive line 150-3 and the fourth conductive line 150-4 are separated from each other by a second distance different from the first distance. For example, the second distance is less than the first distance, but the disclosure is not limited thereto.

Still referring to FIGS. 16, 17A, and 17B, the semiconductor memory structure 100 includes a plurality of first vias V0a coupling the first source structure 140S1 to the first conductive line 150-1 and coupling the first drain structure 140D1 to the second conductive line 150-2. In some embodiments, the first vias V0a can be the zeroth vias of the interconnect structure 200. That is, the memory device formed over the substrate 102 can be coupled to the first metal layers M1 of the interconnect structure 200. The semiconductor memory structure 100 includes a plurality of second vias V1a coupling the first conductive line 150-1 to the first source line SL1 and coupling the second conductive line 150-2 to the first bit line BL1. In some embodiments, the second vias V1a can be the first vias of the interconnect structure 200. That is, the first metal layers M1 of the interconnect structure 200 can be coupled to the second metal layers M2 of the interconnect structure 200. Accordingly, the first vias V0a and the second vias V1a are in different layers of the interconnect structure 200.

The semiconductor memory structure 100 further includes a plurality of third vias V0b coupling the second drain structure 140D2 to the third conductive line 150-3 and coupling the second source structure 140S2 to the fourth conductive line 150-4. As mentioned above, the third vias V0b can be the zeroth vias of the interconnect structure 200. That is, the memory device formed over the substrate 102 can be coupled to the first metal layers M1 of the interconnect structure 200. The semiconductor memory structure 100 further includes a plurality of fourth vias V1b coupling the third conductive line 150-3 to the second bit line BL2 and coupling the fourth conductive line 150-4 to the second source line SL2. In some embodiments, the fourth vias V1b can be the first vias of the interconnect structure 200. That is, the first metal layers M1 of the interconnect structure 200 can be coupled to the second metal layers M2 of the interconnect structure 200. Accordingly, the third vias V0b and the fourth vias V1b are in different layers of the interconnect structure 200.

It should be noted that the first vias V0a and the third vias V0b can be in a same layer or a same level, while the second vias V1a and the fourth vias V1b can be in a same layer or a same level over that of the first vias V0a and the third vias V0b. In some embodiments, the first vias V0a, the third vias V0b, the first conductive layer 150-1, the second conductive layer 150-2, the third conductive layer 150-3 and the fourth conductive layer 150-4 can all be disposed in a same layer, such as a first inter-metal dielectric layer (IMD1). The second vias V1a, the fourth vias V1b, the first source line SL1, the second bit line BL2, the second source line SL2, and the first bit line BL1 can all be disposed in a same layer, such as a second inter-metal dielectric layer (IMD2) over the IMD1. However, the IMD1 and the IMD2 are omitted from FIGS. 17A and 17B. In some embodiments, the first vias V0a and the third vias V0b can be in a same layer, while the first conductive layer 150-1, the second conductive layer 150-2, the third conductive layer 150-3 and the fourth conductive layer 150-4 can be in a same layer. Further, the second vias V1a and the fourth vias V1b are in a same layer while the first source line SL1, the second bit line BL2, the second source line SL2, and the first bit line BL1 can be in a same layer. In such embodiments, the layer accommodating the first vias V0a and the third vias V0b, and the layer accommodating the first conductive layer 150-1, the second conductive layer 150-2, the third conductive layer 150-3 and the fourth conductive layer 150-4 can be referred to as the IMD1. The layer accommodating the second vias V1a and the fourth vias V1b, and the layer accommodating the first source line SL1, the second bit line BL2, the second source line SL2, and the first bit line BL1 can be referred to as the IMD2 over the IMD1.

In some embodiments, the interconnect structure 200 of the semiconductor memory structure 100 includes the first to fourth conductive lines 150-1, 150-2, 150-3 and 150-4 between the source/bit lines SL1, BL2, SL2, and BL1 and the source/drain structures 140S1, 140D2, 140S2, and 140B1 in order to obtain even pitches between the source lines and the bit lines SL1, BL2, SL2 and BL1. In some embodiments, the width of the fourth conductive line 150-4 is made greater than that of the third conductive line 150-3, and the width of the second conductive line 150-2 is made greater than that of the first conductive line 150-1. Further, the second conductive line 150-2 extends to overlap a portion of the isolation 136 while the fourth conductive line 140-4 extends to overlap a portion of the isolation 138 between the second source structure 140S2 and the second drain structure 140D2. In some embodiments, the wider second and fourth conductive lines 150-2 and 150-4 and the different overlapping relationships help to optically arrange the routing of the overlying metal lines. Therefore, even pitches between the source lines and the bit lines SL1, BL2, SL2 and BL1 and a symmetric pattern formed by the source lines and the bit lines SL1, BL2, SL2 and BL1 can be obtained. It is found that the even pitches help to mitigate the issue of difficulty of manufacturing, while the symmetric pattern helps to mitigate the issue of difficulty of design.

Figure 18:
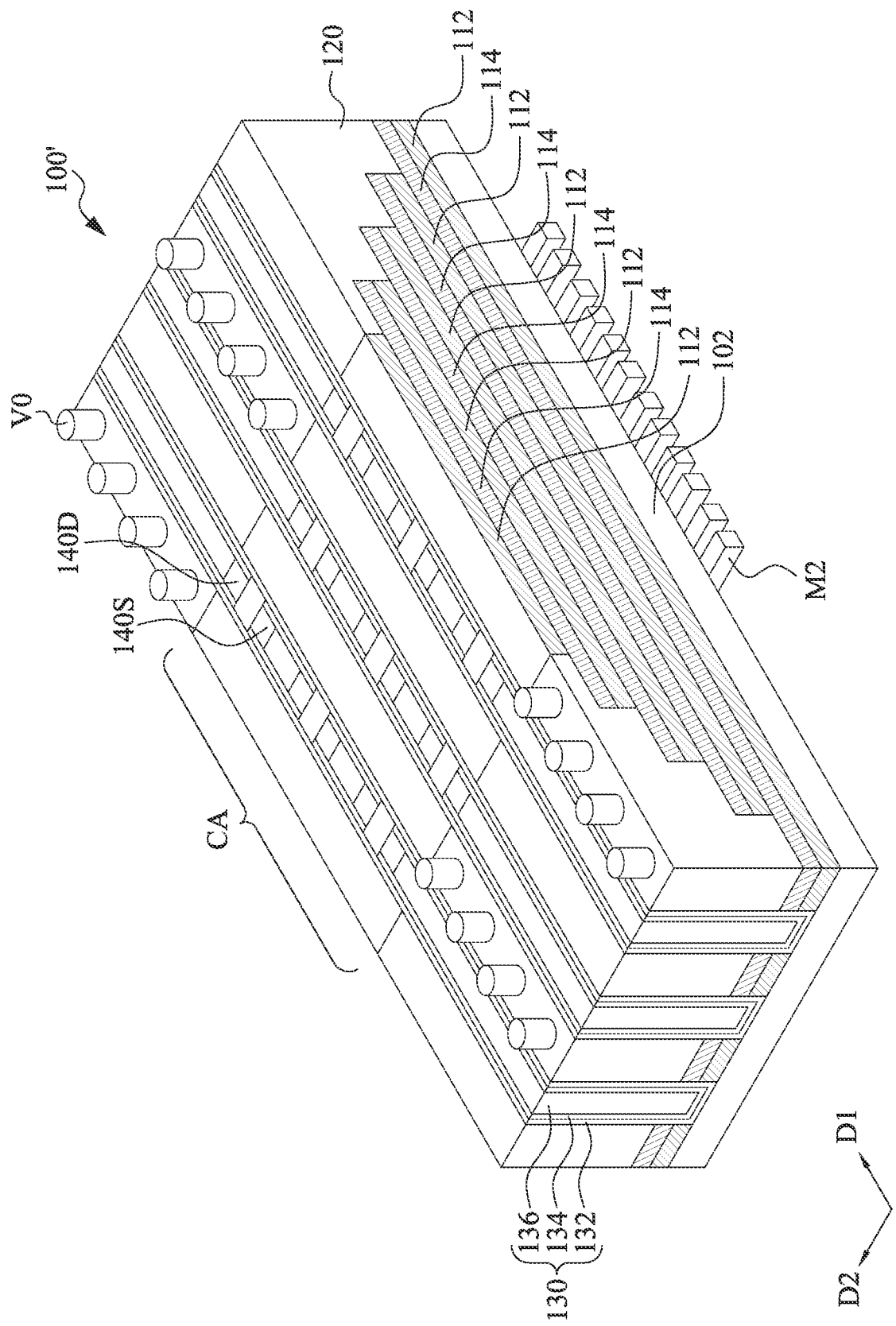
FIG. 18 is a schematic drawing illustrating a portion of a semiconductor memory structure according to aspects of one or more embodiments of the present disclosure.

In some embodiments, the abovementioned interconnect structure 200 can be formed over the memory cells, as shown in FIG. 18. In some alternative embodiments, the abovementioned interconnect structure 200 can be formed under the memory cells, as shown in FIG. 18. The manufacturing operations and element arrangements of the semiconductor memory structure 100' can be similar to those of the semiconductor memory structure 100; therefore, repeated descriptions of such details are omitted for brevity.

Figure 19:
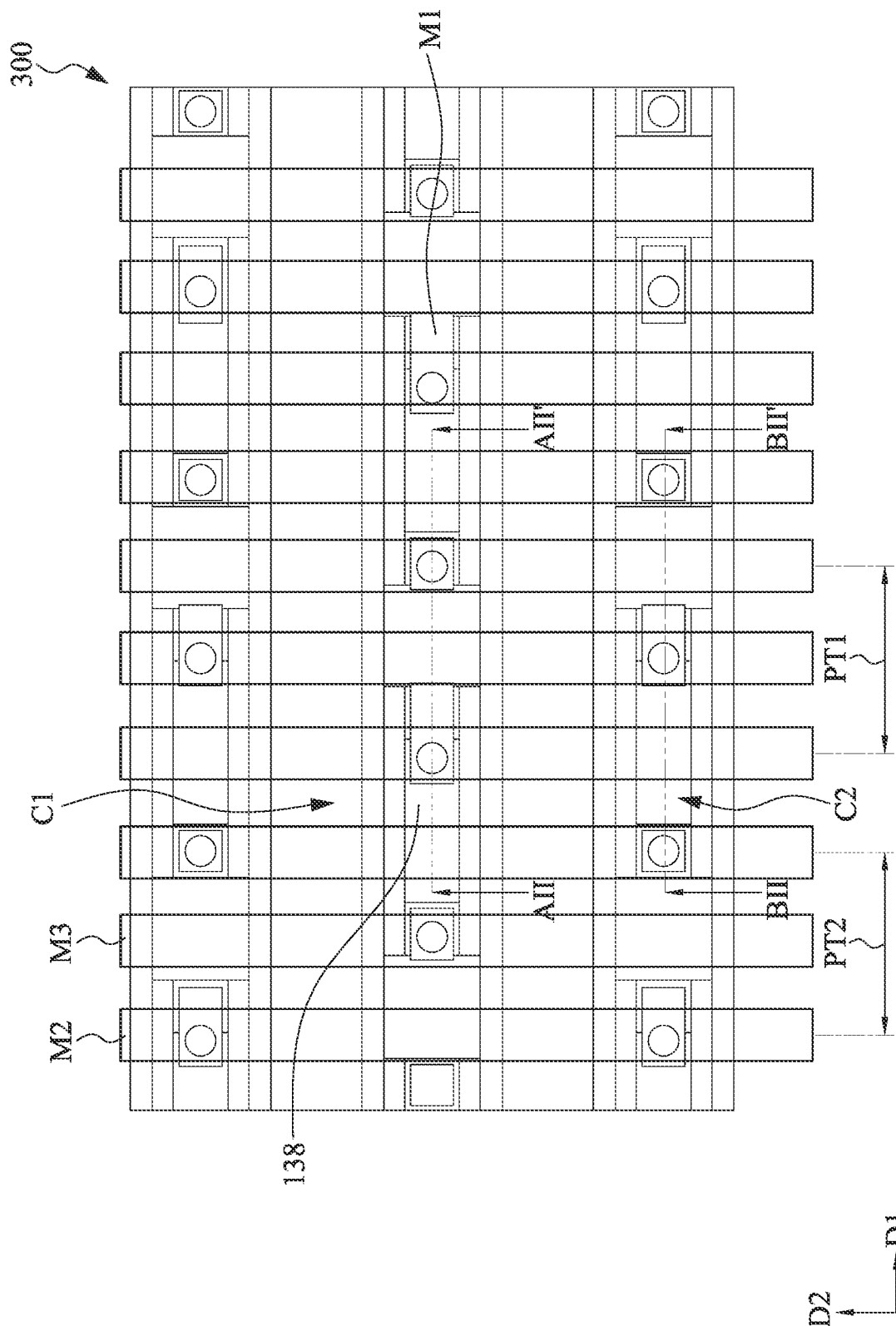
FIG. 19 is a schematic drawing illustrating a layout structure of a portion of a semiconductor memory structure according to aspects of one or more embodiments of the present disclosure.
Figure 20A:
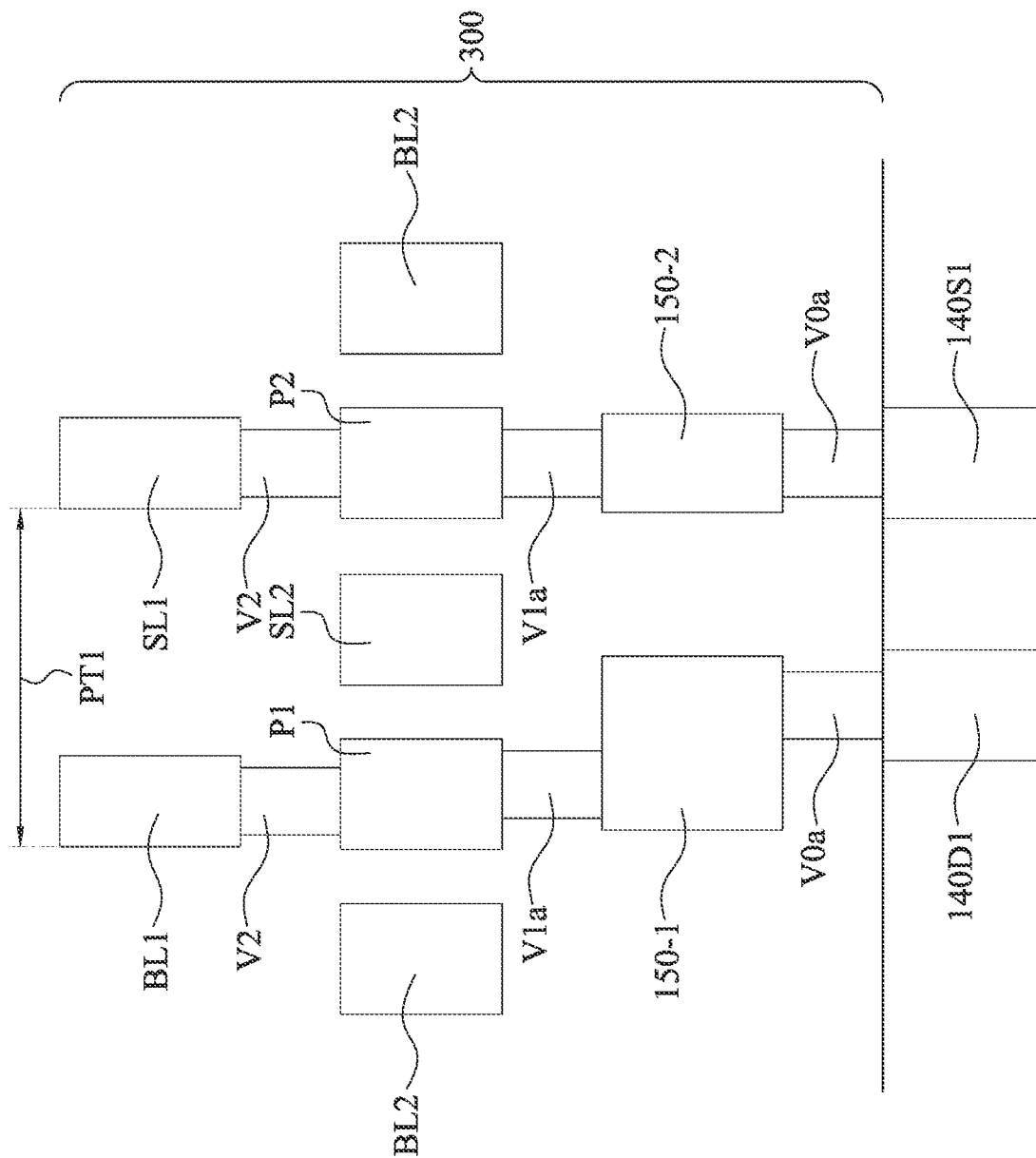
FIGS. 20A and 20B are exemplary cross-sectional views taken along line AII-AII and line BII-BII' in FIG. 19 and schematically illustrate vertical layer arrangements of different portions of an interconnect structure of the semiconductor memory structure according to aspects of one or more embodiments of the present disclosure.
Figure 20B:
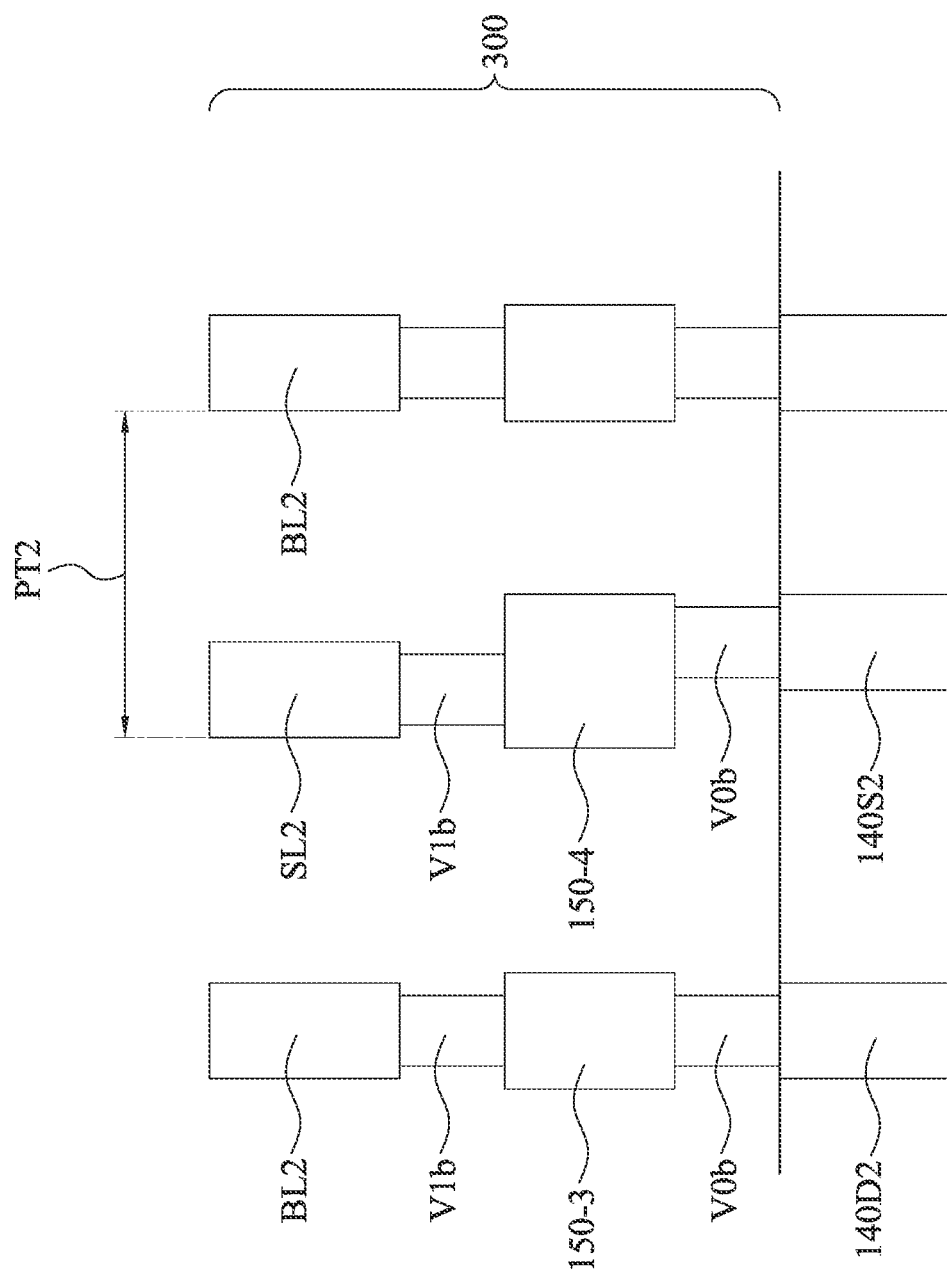

Please refer to FIGS. 19, 20A and 20B, wherein FIG. 19 is a schematic drawing illustrating a layout structure of a portion of a semiconductor memory structure according to aspects of one or more embodiments of the present disclosure, and FIGS. 20A and 20B are exemplary cross-sectional views schematically illustrating vertical layer arrangements of different portions of an interconnect structure 300 of a semiconductor memory structure 100 according to aspects of one or more embodiments of the present disclosure. In some embodiments, the interconnect structure 300 can be disposed over memory cells as mentioned above, but the disclosure is not limited thereto.

In some embodiments, the semiconductor memory structure 100 includes a first cell C1 and a second cell C2. In some embodiments, the first cell C1 and the second cell C2 can be disposed in the cell array region CA. The first cell C1 and the second cell C2 both extend along the first direction D1. Further, the first cell C1 and the second cell C2 are separated from each other along the second direction D2. In some embodiments, the first cell C1 and the second cell C2 are offset from each other along the first direction D1. In some embodiments, the first cell C1 and the second cell C2 can be arranged in a repeating manner in the cell array region CA to form a staggered pattern as shown in FIG. 19. The first cell C1 includes a first source structure 140S1 and a first drain structure 140D1. The first source structure 140S1 is separated from the first drain structure 140D1 by the isolation 138. The second cell C2 includes a second source structure 140S2 and a second drain structure 140D2. The second source structure 140S2 is separated from the second drain structure 140D2 by the isolation 138. It should be noted that the second layers 114 in the stack 110 serve as the gate layers (also referred to as the word lines) in the cell array region CA; therefore, the locations of the gate layers of each memory cell should be easily understood though not shown in FIGS. 19, 20A and 20B.

In some embodiments, the semiconductor memory structure 100 includes a first bit line BL1 coupled to the first drain structure 140D1 and a first source line SL1 coupled to the first source structure 140S1. The semiconductor memory structure 100 includes a second source line SL2 coupled to the second source structure 140S2 and a second bit line BL2 coupled to the second drain structure 140D2. It should be noted that the first source line SL1, the first bit line BL1, the second source line SL2 and the second bit line BL2 extend along the second direction D2. In some embodiments, the first source line SL1 and the first bit line BL1 are in a common layer. For example, the first source line SL1 and the first bit line BL1 can be referred to as the third metal layers M3 of the interconnect structure 300 of the semiconductor memory structure 100. Further, the first source line SL1 and the first bit line BL1 can be periodically arranged to form an SL1/BL1/SL1/BL1 pattern, as shown in FIG. 20A. The second source line SL2 and the second bit line BL2 are in another common layer. For example, the first source line SL1 and the first bit line BL1 can be referred to as the second metal layers M2 of the interconnect structure 300 of the semiconductor memory structure 100. Further, the second source line SL2 and the second bit line BL2 can be periodically arranged to form an SL2/BL2/SL2/BL2 pattern, as shown in FIG. 20B. However, from a top view, the first source line SL1, the first bit line BL1, the second source line SL2 and the second bit line BL2 are arranged to form a BL1/BL2/SL1/SL2 pattern, as shown in FIGS. 19, 20A and 20B.

In some embodiments, a width of a feature can be defined as a distance between two opposite sides measured along the first direction D1. In such embodiments, a width of the first source line SL1 and a width of the first bit line BL1 are similar, while a width of the second source line SL2 and a width of the second bit line BL2 are similar. In some embodiments, the widths of the first source line SL1 and the first bit line BL1 can be similar to the widths of the second source line SL2 and the second bit line BL2. It should be noted that a distance between the first source line SL1 and the first bit line BL1 is similar to a distance between the second source line SL2 and the second bit line BL2, even though the first source and bit lines SL1/BL1 and the second source and/bit lines SL2/BL2 are in different layers. In some embodiments, a pitch PT1 between the adjacent first source line SL1 and first bit line BL1 are substantially the same as a pitch PT2 between the adjacent second source line SL2 and second bit line BL2, as shown in FIG. 19.

The semiconductor memory structure 100 includes a first conductive line 150-1 between the first drain structure 140D1 and the first bit line BL1, a first conductive pad P1 between the first conductive line 150-1 and the first bit line BL1, a second conductive line 150-2 between the first source structure 140S1 and the first source line SL1, and a second conductive pad P2 between the second conductive line 150-2 and the first source line SL1. Further, the semiconductor memory structure 100 includes a third conductive line 150-3 between the second drain structure 140D2 and the second bit line BL2, and a fourth conductive line 150-4 between the second source structure 140S2 and the second source line SL2. As mentioned above, the first conductive line 150-1, the second conductive line 150-2, the third conductive line 150-3 and the fourth conductive line 150-4 are in a common layer. In some embodiments, the first conductive line 150-1, the second conductive line 150-2, the third conductive line 150-3 and the fourth conductive line 150-4 can be referred to as the first metal layers M1 of the interconnect structure 300. Further, the first conductive pad P1 and the second conductive pad P2 are in same common layer as the second bit line BL2 and the second source line SL2. For example, the first conductive pad P1, the second conductive pad P2, the second bit line BL2, and the second source line SL2 can be referred to as the second metal layers M2 of the interconnect structure 300. Further, the second bit line BL2, the first pad P1, the second source line SL2 and the second pad P2 can be periodically arranged, as shown in FIG. 20A. The first bit line BL1 and the first source line SL1 are in a common layer. For example, the first bit line BL1 and the first source line SL1 can be referred to as the third metal layers M3 of the interconnect structure 300.

In some embodiments, a width of the first conductive line 150-1 and a width of the second conductive line 150-2 are different from each other, as shown in FIGS. 19 and 20A. In some embodiments, the width of the second conductive line 150-2 is greater than the width of the first conductive line 150-1. A width of the third conductive line 150-3 and a width of the fourth conductive line 150-4 are also different from each other, as shown in FIGS. 19 and 20B. In some embodiments, the width of the fourth conductive line 150-4 is greater than the width of the third conductive line 150-3. In some embodiments, the first conductive line 150-1 and the second conductive line 150-2 are separated from each other by a first distance while the third conductive line 150-3 and the fourth conductive line 150-4 are separated from each other by a second distance different from the first distance. For example, the second distance is greater than the first distance, but the disclosure is not limited thereto.

In some embodiments, the second conductive line 150-2 extends to overlap a portion of the isolation 138, which is between the first drain structure 140D1 and the first source structure 140S1, and a first overlapping region may be obtained. The fourth conductive line 150-4 extends to overlap a portion of the isolation 138, which is between the second drain structure 140D2 and the second source structure 140S2, and a second overlapping region may be obtained. In some embodiments, the first overlapping region can be greater than the second overlapping region, but the disclosure is not limited thereto.

Still referring to FIGS. 19, 20A and 20B, the semiconductor memory structure 100, includes a plurality of first vias V0$a$ coupling the first drain structure 140D1 to the first conductive line 150-1 and coupling the first source structure 140S1 to the second conductive line 150-2. In some embodiments, the first vias V0$a$ can be referred to as the zeroth vias of the interconnect structure 300. The semiconductor memory structure 100 includes a plurality of second vias V1$a$ coupling the first conductive line 150-1 to the first conductive pad P1 and coupling the second conductive line 150-2 to the second conductive pad P2. In some embodiments, the second vias V1$a$ can be referred to as the first vias of the interconnect structure 300. The semiconductor memory structure 100 further includes a plurality of third vias V2 coupling the first conductive pad P1 to the first bit line BL1 and the second conductive pad P2 to the first source line SL1. In some embodiments, the third vias V2 can be referred to as the second vias of the interconnect structure 300. Accordingly, the first vias V0$a$, the second vias V1$a$, and the third vias V2 are in different layers of the interconnect structure 300.

The semiconductor memory structure 100 further includes a plurality of fourth vias V0$b$ coupling the second drain structure 140D2 to the third conductive line 150-3 and coupling the second source structure 140S2 to the fourth conductive line 150-4. In some embodiments, the fourth vias V0$b$ can be referred to as the zeroth vias of the interconnect structure 300. The semiconductor memory structure 100 further includes a plurality of fifth vias V1$b$ coupling the third conductive line 150-3 to the second bit line BL2 and coupling the fourth conductive line 150-4 to the second source line SL2. In some embodiments, the fifth vias V1$b$ can be referred to as the first vias of the interconnect structure 300. Accordingly, the fourth vias V0$b$ and the fifth vias V1$b$ are in different layers of the interconnect structure 300.

It should be noted that the first vias V0$a$ and the fourth vias V0$b$ can be in a same layer or a same level, while the second vias V1$a$ and the fifth vias V1$b$ can be in a same layer or a same level over that of the first vias V0$a$ and the fourth vias V0$b$. In some embodiments, the first vias V0$a$, the fourth vias V0$b$, the first conductive layer 150-1, the second conductive layer 150-2, the third conductive layer 150-3 and the fourth conductive layer 150-4 can all be disposed in a same layer, such as a first inter-metal dielectric layer (IMD1). The second vias V1$a$, the fifth vias V1$b$, the first pad P1, the second pad P2, the second bit line BL2, and the second source line SL2 can all be disposed in a same layer, such as a second inter-metal dielectric layer (IMD2) over the IMD1. The third vias V2, the first source line SL1 and the first bit line BL1 can be disposed in a same layer, such as the third inter-metal dielectric layer (IMD3) over the IMD2. However, the IMD1, the IMD2 and the IMD3 are omitted from FIGS. 20A and 20B. In some embodiments, the first vias V0a and the fourth vias V0b can be in a same layer, while the first conductive layer 150-1, the second conductive layer 150-2, the third conductive layer 150-3 and the fourth conductive layer 150-4 can be in a same layer. The layer accommodating the first vias V0a and the fourth vias V0b, and the layer accommodating the first conductive layer 150-1, the second conductive layer 150-2, the third conductive layer 150-3 and the fourth conductive layer 150-4 can be referred to as the IMD1. Further, the second vias V1a and the fifth vias V1b are in a same layer while the first pad P1, the second pad P2, the second bit line BL2 and the second source line SL2 can be in a same layer. The layer accommodating the second vias V1a and the fifth vias V1b, and the layer accommodating the first pad P1, the second pad P2, the second bit line BL2 and the second source line SL2 can be referred to as the IMD2 over the IMD1. The third vias V2 can be in one layer while the first source line SL1 and the first bit line BL1 are in another layer. The layer accommodating the third via V2 and the layer accommodating the first source line SL1 and the first bit line BL1 can be referred to as the IMD3 over the IMD2.

In some embodiments, the interconnect structure 300 of the semiconductor memory structure 100 includes the first to fourth conductive lines 150-1, 150-2, 150-3, 150-4; the first and second pads P1, P2 between the source and bit lines SL1, BL2, SL2, BL1; and the source and drain structures 140S1, 140D2, 140S2, 140B1 in order to obtain even pitches between the source and bit lines BL1, BL2, SL1, SL2. In some embodiments, the first source line SL1 and the first bit line BL1 for connecting the first cell C1 are formed in the layer overlying the second source line SL2 and the second bit line BL2 for connecting the second cell C2. Further, the rearrangement of routing can be achieved by introduction of the conductive lines 150-1 to 150-4 and the conductive pads P1 and P2. Consequently, even pitches are obtained between the first source lines SL1 and the first bit lines BL1 in the same layer. Further, even pitches are obtained between the second bit line BL2, the first pad P1, the second source line SL2 and the second pad P2 in the same layer. Further, a symmetric pattern formed by the first source lines SL1 and the first bit lines BL1 in the same layer is obtained, while a symmetric pattern formed by the second bit line BL2, the first pad P1, the second source line SL2 and the second pad P2 in the same layer is obtained. It is found that the even pitches help to mitigate the issue of difficulty of manufacturing, while the symmetric pattern helps to mitigate the issue of difficulty of design.

Accordingly, the present disclosure provides a semiconductor memory structure and an interconnect structure of the semiconductor memory structure. In some embodiments, the semiconductor memory structure includes an even SL/BL line pitch and a symmetric layout structure. In some embodiments, by introducing the intervening conductive lines, such as the first to fourth conductive lines between the source/bit lines and the source/drain structures, the source/bit line (SL/BL) routing can be arranged such that the line pitch can be made even. In some embodiments, by separating even metal lines of different cells in different layers, the line pitch can be increased and made even. Accordingly, the uneven line pitch issue is mitigated and a symmetric interconnect layout structure can be obtained.

In some embodiments, a semiconductor memory structure is provided. The semiconductor memory structure includes a first cell, a second cell, a first bit line, a first source line, a second bit line and a second source line. The first cell and the second cell extend along a first direction. The first cell and the second cell are separated from each other along a second direction different from the first direction. The first cell includes a first source structure and a first drain structure, and the second cell includes a second source structure and a second drain structure. The first source line is coupled to the first source structure, and the first bit line is coupled to the first drain structure. The second source line is coupled to the second source structure, and the second bit line is coupled to the second drain structure. The first source line and the first bit line are in a first common layer of an interconnect structure. The second bit line and the second source line are in a second common layer of the interconnect structure. The second common layer is under the first common layer. A distance between the first source line and the first bit line is similar to a distance between the second source line and the second bit line.

In some embodiments, an interconnect structure is provided. The interconnect structure includes a first conductive line over a first drain structure of a first cell, a second conductive line over a first source structure of the first cell, a first pad over the first conductive line, a second pad over the second conductive line, a first bit line over the first pad, a first source line over the second pad, a third conductive line over a second drain structure of a second cell, a fourth conductive line over a second source structure of the second cell, a second bit line over the third conductive line, and a second source line over the fourth conductive line. The second source line, the second bit line, the first pad and the second pad are disposed in a first common layer.

In some embodiments, a semiconductor structure is provided. The semiconductor structure includes a first source structure, a first drain structure, a second source structure, a second drain structure in a first common layer. The semiconductor structure includes a first conductive layer coupled to the first drain structure, a second conductive layer coupled to the first source structure, a third conductive layer coupled to the second drain structure, and a fourth conductive layer coupled to the second source structure. The first conductive layer, the second conductive layer, the third conductive layer and the fourth conductive layer are disposed in a second common layer. The semiconductor structure includes a first bit line and a first source line disposed in a third common layer. The semiconductor structure includes a second bit line coupled to the third conductive layer, a second source line coupled to the fourth conductive layer, a first pad coupled to the first conductive layer and the first bit line, and a second pad coupled to the second conductive layer. The second bit line, the second source line, the first pad and the second pad are disposed in a fourth common layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory structure comprising:
   a first cell extending along a first direction and comprising a first source structure and a first drain structure;
   a second cell extending along the first direction and comprising a second source structure and a second drain structure, wherein the first cell and the second cell are separated from each other along a second direction different from the first direction;
   a first bit line coupled to the first drain structure and a first source line coupled to the first source structure; and
   a second bit line coupled to the second drain structure and a second source line coupled to the second source structure,
   wherein the first source line and the first bit line are in a first common layer of an interconnect structure, the second source line and the second bit line are in a second common layer of the interconnect structure, and the second common layer is under the first common layer,
   wherein a distance between the first source line and the first bit line is similar to a distance between the second source line and the second bit line.

2. The semiconductor memory structure of claim 1, further comprising:
   a first conductive line between the first drain structure and the first bit line;
   a second conductive line between the first source structure and the first source line;
   a first conductive pad between the first bit line and the second conductive line; and
   a second conductive pad between the first source line and the first conductive line.

3. The semiconductor memory structure of claim 2, wherein the first conductive pad and the second conductive pad are in the second common layer of the interconnect structure.

4. The semiconductor memory structure of claim 2, further comprising:
   a plurality of first vias coupling the first drain structure to the first conductive line and coupling the first source structure to the second conductive line;
   a plurality of second vias coupling the first conductive line to the first conductive pad and coupling the second conductive line to the second conductive pad; and
   a plurality of third vias coupling the first conductive pad to the first bit line and the second conductive pad to the first source line,
   wherein the first vias, the second vias and the third vias are in different layers of the interconnect structure.

5. The semiconductor memory structure of claim 2, further comprising:
   a third conductive line between the second drain structure and the second bit line; and
   a fourth conductive line between the second source structure and the second source line.

6. The semiconductor memory structure of claim 5, further comprising:
   a plurality of fourth vias coupling the second drain structure to the third conductive line and coupling the second source structure to the fourth conductive line; and
   a plurality of fifth vias coupling the third conductive line to the second bit line and coupling the fourth conductive line to the second source line,
   wherein the fourth vias and the fifth vias are in different layers of the interconnect structure.

7. The semiconductor memory structure of claim 5, wherein the first conductive line, the second conductive line, the third conductive line and the fourth conductive line are in a third common layer of the interconnect structure.

8. The semiconductor memory structure of claim 7, wherein the third common layer is under the second common layer.

9. An interconnect structure comprising:
   a first conductive line over a first drain structure of a first cell and a second conductive line over a first source structure of the first cell;
   a first pad over the first conductive line and a second pad over the second conductive line;
   a first bit line over the first pad and a first source line over the second pad;
   a third conductive line over a second drain structure of a second cell and a fourth conductive line over a second source structure of the second cell; and
   a second bit line over the third conductive line and a second source line over the fourth conductive line,
   wherein the second source line, the second bit line, the first pad and the second pad are disposed in a first common layer.

10. The interconnect structure of claim 9, wherein a distance between the first source line and the first bit line is similar to a distance between the second source line and the second bit line.

11. The interconnect structure of claim 9, wherein the first conductive line, the second conductive line, the third conductive line and the fourth conductive line are in a second common layer under the first common layer.

12. The interconnect structure of claim 11, wherein the first bit line and the first source line are disposed in a third common layer over the first common layer.

13. The interconnect structure of claim 9, wherein the second bit line, the first pad, the second source line and the second pad are periodically arranged.

14. The interconnect structure of claim 9, further comprising:
    a plurality of first vias electrically connecting the first bit line, the first pad, the first conductive line to the first drain structure; and
    a plurality of second vias electrically connecting the first source line, the second pad, the second conductive line to the first source structure.

15. The interconnect structure of claim 9, further comprising:
    a plurality of third vias electrically connecting the second bit line, the third conductive line to the second drain structure; and
    a plurality of fourth vias electrically connecting the second source line, the fourth conductive line to the second source structure.

16. A semiconductor structure comprising:
    a first source structure, a first drain structure, a second source structure and a second drain structure disposed in a first common layer;
    a first conductive layer coupled to the first drain structure, a second conductive layer coupled to the first source structure, a third conductive layer coupled to the second drain structure and a fourth conductive layer coupled to the second source structure, wherein the first conductive layer, the second conductive layer, the third conductive layer and the fourth conductive layer are disposed in a second common layer;
    a first bit line and a first source line disposed in a third common layer; and a second bit line coupled to the third conductive layer, a second source line coupled to the fourth conductive layer, a first pad coupled to the first conductive layer and the first bit line, and a second pad coupled to the second conductive layer, wherein the second bit line, the second source line, the first pad and the second pad are disposed in a fourth common layer.

17. The semiconductor structure of claim 16, wherein the second common layer is over the first common layer, the third common layer is over the second common layer, and the fourth common layer is between the second common layer and the third common layer.

18. The semiconductor structure of claim 16, wherein a distance between the first source line and the first bit line is similar to a distance between the second source line and the second bit line.

19. The semiconductor structure of claim 16, wherein the second bit line, the first pad, the second source line and the second pad are periodically arranged in the fourth common layer.

20. The semiconductor structure of claim 16, further comprising:
- a plurality of first vias electrically connecting the first drain structure to the first conductive layer, electrically connecting the first source structure to the second conductive layer, electrically connecting the second drain structure to the third conductive layer, and electrically connecting the second source structure to the fourth conductive layer;
- a plurality of second vias electrically connecting the first conductive layer to the first pad, electrically connecting the second conductive layer to the second pad, electrically connecting the third conductive layer to the second bit line, and electrically connecting the fourth conductive layer to the second source line; and
- a plurality third vias electrically connecting the first pad to the first bit line, and electrically connecting the second pad to the first source line.

\* \* \* \* \*